(12) United States Patent
Hatzilias et al.

(10) Patent No.: US 12,074,408 B2
(45) Date of Patent: Aug. 27, 2024

(54) VERTICAL CAVITY SURFACE-EMITTING LASER (VCSEL) WITH A LIGHT BARRIER

(71) Applicant: META PLATFORMS TECHNOLOGIES, LLC, Menlo Park, CA (US)

(72) Inventors: Karol Constantine Hatzilias, Kenmore, WA (US); Christopher Yuan Ting Liao, Seattle, WA (US); Robin Sharma, Redmond, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 797 days.

(21) Appl. No.: 16/654,331

(22) Filed: Oct. 16, 2019

(65) Prior Publication Data

US 2021/0098962 A1    Apr. 1, 2021

Related U.S. Application Data

(60) Provisional application No. 62/909,083, filed on Oct. 1, 2019.

(51) Int. Cl.
*H01S 5/183*    (2006.01)
*G02B 27/00*    (2006.01)
(Continued)

(52) U.S. Cl.
CPC .......... *H01S 5/026* (2013.01); *G02B 27/0093* (2013.01); *H01S 5/1078* (2013.01);
(Continued)

(58) Field of Classification Search
CPC ........ H01S 5/026; H01S 5/1078; H01S 5/183; H01S 5/18347; H01S 2301/02; G02B 27/0093
See application file for complete search history.

(56) References Cited

U.S. PATENT DOCUMENTS 5,757,836 A    5/1998    Jiang et al.
6,148,016 A    11/2000    Hegblom et al.
(Continued)

FOREIGN PATENT DOCUMENTS

CN    107768979 B *    7/2019    ............. H01S 5/183
EP    0691717 A1    1/1996

OTHER PUBLICATIONS

Machine Translation of CN107768979B (Year: 2019).*
(Continued)

*Primary Examiner* — Yuanda Zhang
(74) *Attorney, Agent, or Firm* — Morgan, Lewis & Bockius LLP

(57) ABSTRACT

A light source structure includes a vertical cavity surface-emitting laser (VCSEL) device having a top surface and at least one side surface substantially perpendicular to and adjoining the top surface. The VCSEL device is configurable to output directed emission of light through the top surface. The light source structure also includes a light barrier surrounding at least a top portion of the VCSEL device and separated from the at least one side surface. The light barrier is configured to receive spontaneous emission out of the VCSEL device through the at least one side surface.

18 Claims, 17 Drawing Sheets

(51) Int. Cl.
*H01S 5/026* (2006.01)
*H01S 5/10* (2021.01)

(52) U.S. Cl.
CPC .......... *H01S 5/183* (2013.01); *H01S 5/18347* (2013.01); *H01S 2301/02* (2013.01)

(56) References Cited

U.S. PATENT DOCUMENTS

| | | | |
|---|---|---|---|
| 2005/0286584 A1* | 12/2005 | Guenter | .............. H01S 5/18308 372/50.1 |
| 2005/0286586 A1 | 12/2005 | Guenter et al. | |
| 2009/0289266 A1 | 11/2009 | Lee et al. | |
| 2010/0181578 A1 | 7/2010 | Li et al. | |
| 2011/0182314 A1 | 7/2011 | Yoshikawa et al. | |
| 2019/0286228 A1* | 9/2019 | Sangu | ................ G02B 27/0172 |

OTHER PUBLICATIONS

International Preliminary Report on Patentability for International Application No. PCT/US2020/053770, mailed Apr. 14, 2022, 12 pages.

International Search Report and Written Opinion for International Application No. PCT/US2020/053770, mailed Mar. 15, 2021, 15 Pages.

Office Action mailed Mar. 21, 2023 for European Patent Application No. 20793889.5, filed on Oct. 1, 2020, 8 pages.

Office Action mailed Nov. 30, 2023 for Chinese Application No. 202080051049.3, filed Oct. 1, 2020, 9 pages.

* cited by examiner

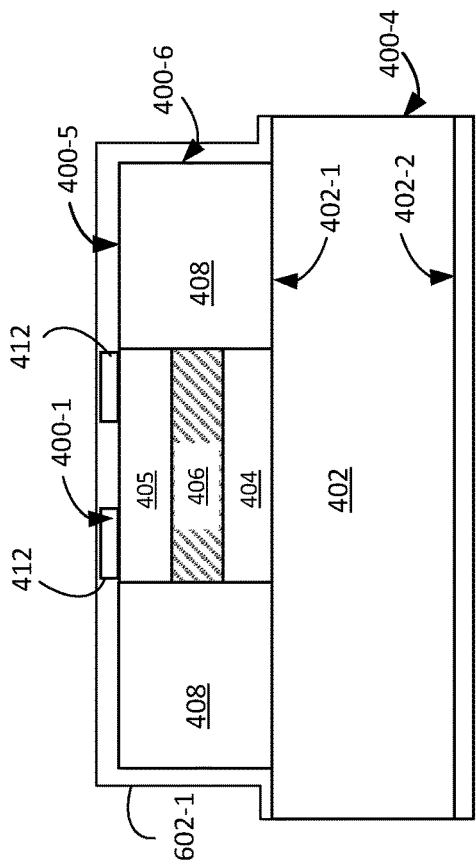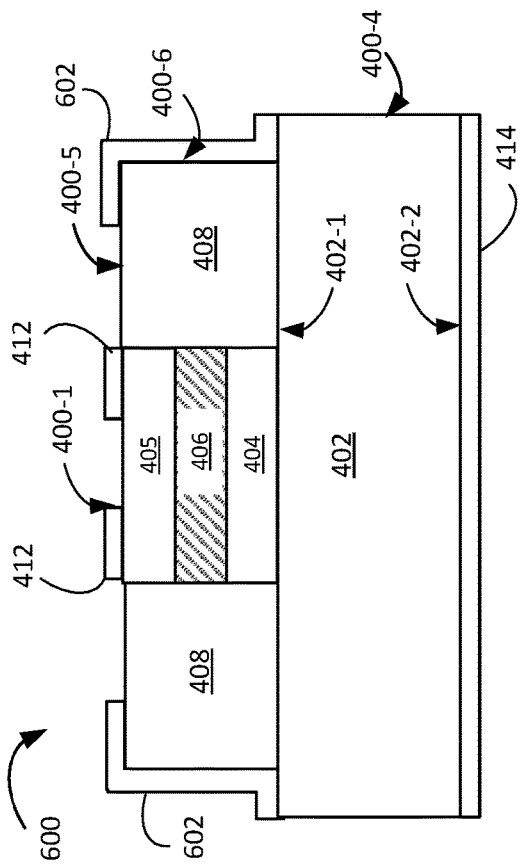
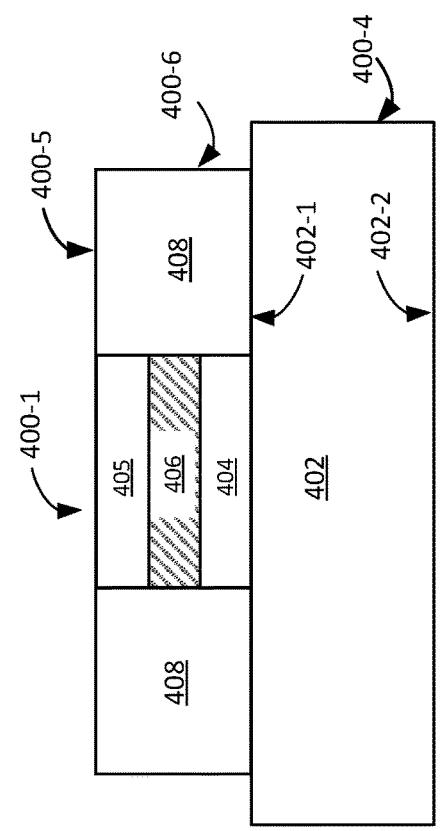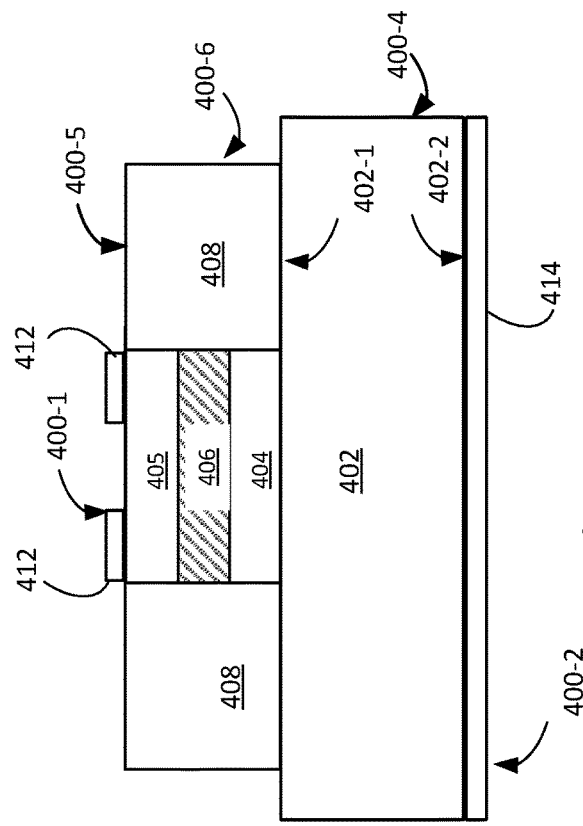
Figure 6B
Figure 6C
Figure 6D
Figure 6E

VERTICAL CAVITY SURFACE-EMITTING LASER (VCSEL) WITH A LIGHT BARRIER

RELATED APPLICATIONS

This application claims priority to U.S. Provisional Application No. 62/909,083, filed Oct. 1, 2019, entitled "Vertical Cavity Surface-Emitting Laser (VCSEL) with a Light Barrier," which is hereby incorporated by reference in its entirety.

TECHNICAL FIELD

This relates generally to vertical cavity surface-emitting lasers (VCSELs) and more specifically to VCSELs used in eye-tracking systems.

BACKGROUND

Vertical cavity surface-emitting lasers (VCSELs) are semiconductor laser diodes that provide light emission in a direction perpendicular to their respective top surfaces. Due to the directionality of the laser emission, VCSELs are useful as light sources for photosensing systems. A challenge arises, however, when a VCSEL and a photosensor are positioned in close proximity to each other. In addition to the directional laser emissions, VCSELs tend to also produce spontaneous emissions in other directions. The spontaneous emission received by the photosensor increases noise, thereby reducing the accuracy of detection. For example, in an eye-tracking device, the spontaneous emission received by the photosensor reduces the accuracy of detecting a position of an eye of a user.

Therefore, there is a need for compact sized VCSEL light source structures with reduced spontaneous emission.

SUMMARY

The above deficiencies and other problems associated with VCSELs are reduced or eliminated by the disclosed light source structure including a VCSEL and a light barrier for blocking spontaneous emission output by the VCSEL.

In accordance with some embodiments, a light source structure includes a vertical cavity surface-emitting laser (VCSEL) device having a top surface and at least one side surface substantially perpendicular to and adjoining the top surface. The VCSEL device is configurable to output directed emission of light through the top surface. The light source structure also includes a light barrier surrounding at least a top portion of the VCSEL device and separated from the at least one side surface. The light barrier is configured to receive spontaneous emission out of the VCSEL device through the at least one side surface.

In accordance with some embodiments, a method of making a light source structure includes fabricating a vertical cavity surface-emitting laser (VCSEL) device on a substrate. The VCSEL device has a top surface and at least one side surface substantially perpendicular to and adjoining the top surface. The VCSEL device is configurable to output directed emission of light through the top surface. The method also includes forming a light barrier surrounding at least a top portion of the VCSEL device and separated from the at least one side surface. The light barrier is configured to receive spontaneous emission out of the VCSEL device through the at least one side surface.

In accordance with some embodiments, an eye-tracking apparatus includes a light source structure configured to project light to an eye of a user and a photodetector configured to receive the light projected by the light source structure reflected off the eye of the user. The light source structure includes a vertical cavity surface-emitting laser (VCSEL) device having a top surface and at least one side surface substantially perpendicular to and adjoining the top surface. The VCSEL device is configurable to output directed emission of light through the top surface. The light source structure also includes a light barrier surrounding at least a top portion of the VCSEL device and separated from the at least one side surface. The light barrier is configured to block spontaneous emission out of the VCSEL device through the at least one side surface from reaching the photodetector.

Thus, the VCSEL device according to some embodiments can be integrated with a photodetector, and can be, for example, fabricated on a common substrate with the photodetector, resulting in a VCSEL-photodetector combination that has a very compact size, and is applicable to eye-tracking systems used in head-mounted display devices. In some embodiments, the VCSEL and the photodetector are positioned in close proximity to each other (e.g., side-by-side) without the photodetector receiving significant spontaneous emission through the side surface of the VCSEL, in addition to the directional light reflected off of an object for detection (e.g., an eye of a user).

In accordance with some embodiments, a head-mounted display device includes a display, an optical assembly optically coupled to the display, and the eye-tracking apparatus described above disposed proximate to the display and the optical assembly.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures. These figures are not drawn to scale unless indicated otherwise.

Components of the present invention illustrated in the following drawings with dashed lines are optional components.

FIGS. 6B-6E are schematic diagrams illustrating a method of fabricating the light source structure of FIG. 6A, in accordance with some embodiments.

DETAILED DESCRIPTION

A light source structure of the present disclosure includes a vertical cavity surface-emitting laser (VCSEL) configured to output directed stimulated emission through a top surface of the VCSEL and a light barrier configured to receive spontaneous emission through a side surface of the VCSEL. The light barrier surrounds the VCSEL and is configured so that the light barrier does not significantly add to a size of the VCSEL. Such light source device is desirable for eye-tracking devices used in head-mounted display devices, due to its compact size and reduced output of spontaneous emission.

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first surface could be termed a second surface, and, similarly, a second surface could be termed a first surface, without departing from the scope of the various described embodiments. The first surface and the second surface are both surfaces, but they are not the same surface.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind."

Figure 1:
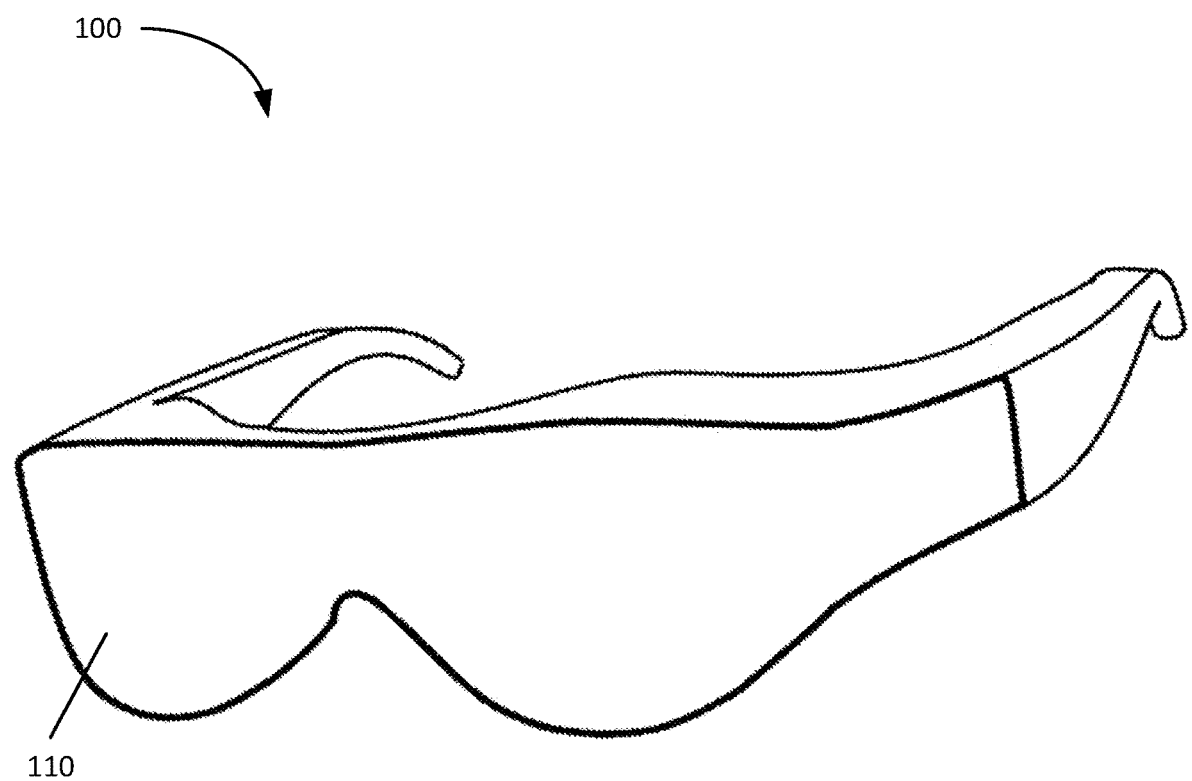
FIG. 1 is a perspective view of a display device in accordance with some embodiments.

FIG. 1 illustrates a perspective view of display device 100 in accordance with some embodiments. In some embodiments, display device 100 is configured to be worn on a head of a user (e.g., by having the form of spectacles or eyeglasses, as shown in FIG. 1, or to be included as part of a helmet that is to be worn by the user). When display device 100 is configured to be worn on a head of a user, display device 100 is called a head-mounted display. Alternatively, display device 100 is configured for placement in proximity of an eye or eyes of the user at a fixed location, without being head-mounted (e.g., display device 100 is mounted in a vehicle, such as a car or an airplane, for placement in front of an eye or eyes of the user). As shown in FIG. 1, display device 100 includes display 110. Display 110 is configured for presenting visual contents (e.g., augmented reality contents, virtual reality contents, mixed-reality contents, or any combination thereof) to a user. In some embodiments, display 110 is a clip-on display. A clip-on display is configured to be coupled (e.g., clipped on) to a frame of a headset (e.g., a frame of goggles) for displaying visual contents. The clip-on display is further configured to be un-coupled from the frame of the headset.

Figure 2:
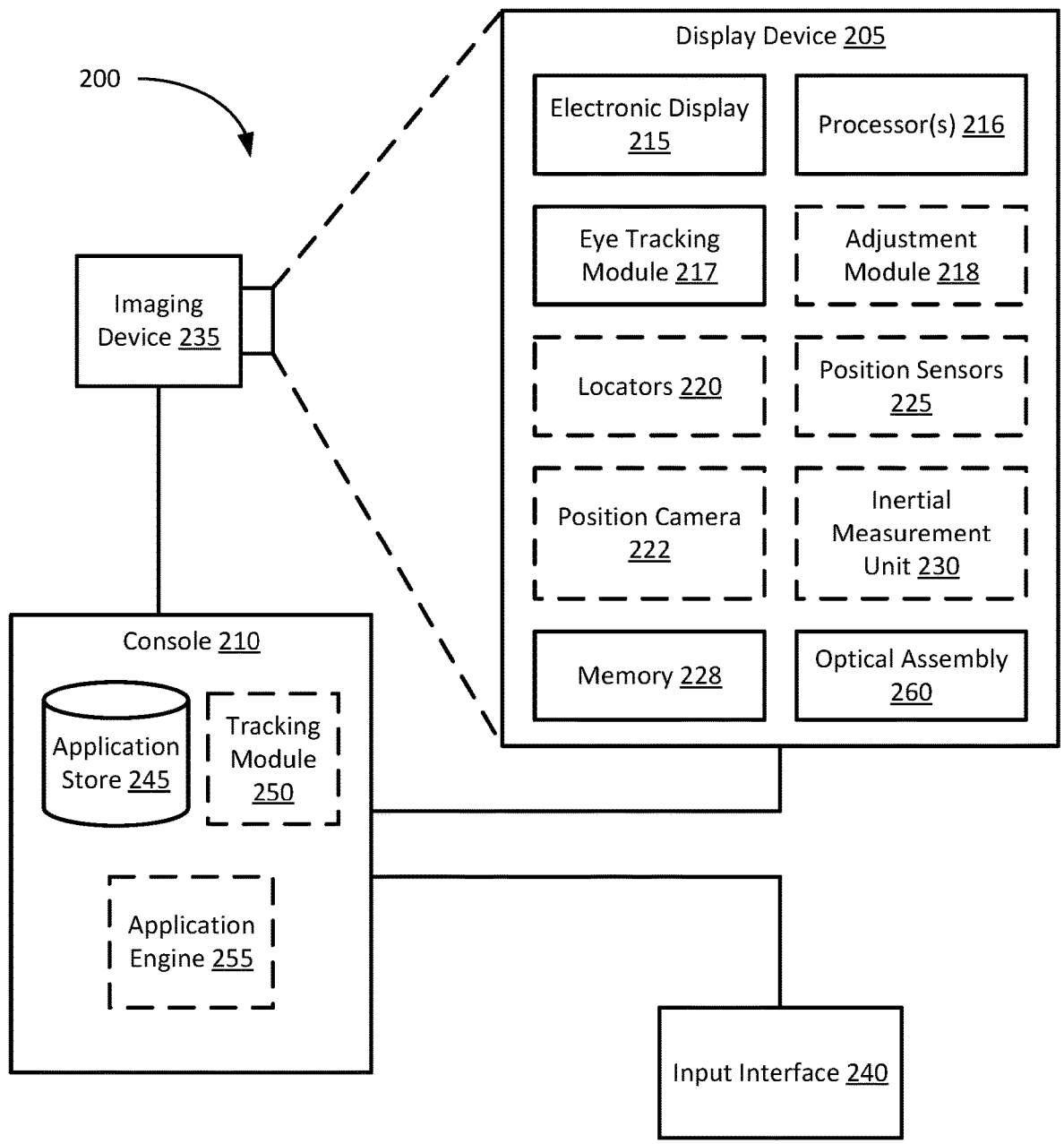
FIG. 2 is a block diagram of a system including a display device in accordance with some embodiments.

In some embodiments, display device 100 includes one or more components described herein with respect to FIG. 2. In some embodiments, display device 100 includes additional components not shown in FIG. 2.

FIG. 2 is a block diagram of system 200 in accordance with some embodiments. The system 200 shown in FIG. 2 includes display device 205 (which corresponds to display device 100 shown in FIG. 1), imaging device 235, and input interface 240 that are each coupled to console 210. While FIG. 2 shows an example of system 200 including display device 205, imaging device 235, and input interface 240, in other embodiments, any number of these components may be included in system 200. For example, there may be multiple display devices 205 each having associated input interface 240 and being monitored by one or more imaging devices 235, with each display device 205, input interface 240, and imaging devices 235 communicating with console 210. In alternative configurations, different and/or additional components may be included in system 200. For example, in some embodiments, console 210 is connected via a network (e.g., the Internet) to system 200 or is self-contained as part of display device 205 (e.g., physically located inside display device 205). In some embodiments, display device 205 is used to create mixed-reality by adding in a view of the real surroundings. Thus, display device 205 and system 200 described here can deliver augmented reality, virtual reality, and mixed-reality.

In some embodiments, as shown in FIG. 1, display device 205 is a head-mounted display that presents media to a user. Examples of media presented by display device 205 include one or more images, video, audio, or some combination thereof. In some embodiments, audio is presented via an external device (e.g., speakers and/or headphones) that receives audio information from display device 205, console 210, or both, and presents audio data based on the audio information. In some embodiments, display device 205 immerses a user in an augmented environment.

In some embodiments, display device 205 also acts as an augmented reality (AR) headset. In these embodiments, display device 205 augments views of a physical, real-world environment with computer-generated elements (e.g., images, video, sound, etc.). Moreover, in some embodiments, display device 205 is able to cycle between different types of operation. Thus, display device 205 operate as a virtual reality (VR) device, an augmented reality (AR) device, as glasses or some combination thereof (e.g., glasses with no optical correction, glasses optically corrected for the user, sunglasses, or some combination thereof) based on instructions from application engine 255.

Display device 205 includes electronic display 215, one or more processors 216, eye-tracking module 217, adjustment module 218, one or more locators 220, one or more position sensors 225, one or more position cameras 222, memory 228, inertial measurement unit (IMU) 230, one or more optical assemblies 260, or a subset or superset thereof (e.g., display device 205 with electronic display 215, optical assembly 260, without any other listed components). Some embodiments of display device 205 have different modules than those described here. Similarly, the functions can be distributed among the modules in a different manner than is described here.

One or more processors 216 (e.g., processing units or cores) execute instructions stored in memory 228. Memory 228 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 228, or alternately the non-volatile memory device(s) within memory 228, includes a non-transitory computer readable storage medium. In some embodiments, memory 228 or the computer readable storage medium of memory 228 stores programs, modules and data structures, and/or instructions for displaying one or more images on electronic display 215.

Electronic display 215 displays images to the user in accordance with data received from console 210 and/or processor(s) 216. In various embodiments, electronic display 215 may comprise a single adjustable display element or multiple adjustable display elements (e.g., a display for each eye of a user). In some embodiments, electronic display 215 is configured to project images to the user through one or more optical assemblies 260.

In some embodiments, the display element includes one or more light emission devices and a corresponding array of spatial light modulators. A spatial light modulator is an array of electro-optic pixels, opto-electronic pixels, some other array of devices that dynamically adjust the amount of light transmitted by each device, or some combination thereof. These pixels are placed behind one or more lenses. In some embodiments, the spatial light modulator is an array of liquid crystal based pixels in an LCD (a Liquid Crystal Display). Examples of the light emission devices include: an organic light emitting diode, an active-matrix organic light-emitting diode, a light emitting diode, some type of device capable of being placed in a flexible display, or some combination thereof. The light emission devices include devices that are capable of generating visible light (e.g., red, green, blue, etc.) used for image generation. The spatial light modulator is configured to selectively attenuate individual light emission devices, groups of light emission devices, or some combination thereof. Alternatively, when the light emission devices are configured to selectively attenuate individual emission devices and/or groups of light emission devices, the display element includes an array of such light emission devices without a separate emission intensity array.

One or more optical components in the one or more optical assemblies 260 direct light from the arrays of light emission devices (optionally through the emission intensity arrays) to locations within each eyebox. An eyebox is a region that is occupied by an eye of a user of display device 205 (e.g., a user wearing display device 205) who is viewing images from display device 205. In some embodiments, the eyebox is represented as a 10 mm×10 mm square. In some embodiments, the one or more optical components include one or more coatings, such as anti-reflective coatings.

In some embodiments, the display element includes an infrared (IR) detector array that detects IR light that is retro-reflected from the retinas of a viewing user, from the surface of the corneas, lenses of the eyes, or some combination thereof The IR detector array includes an IR sensor or a plurality of IR sensors that each correspond to a different position of a pupil of the viewing user's eye. In alternate embodiments, other eye-tracking systems may also be employed.

Eye tracking module 217 determines locations of each pupil of a user's eyes. In some embodiments, eye-tracking module 217 instructs electronic display 215 to illuminate the eyebox with IR light (e.g., via IR emission devices in the display element).

A portion of the emitted IR light will pass through the viewing user's pupil and be retro-reflected from the retina toward the IR detector array, which is used for determining the location of the pupil. Alternatively, the reflection off of the surfaces of the eye is used to also determine location of the pupil. The IR detector array scans for retro-reflection and identifies which IR emission devices are active when retro-reflection is detected. Eye tracking module 217 may use a tracking lookup table and the identified IR emission devices to determine the pupil locations for each eye. The tracking lookup table maps received signals on the IR detector array to locations (corresponding to pupil locations) in each eyebox. In some embodiments, the tracking lookup table is generated via a calibration procedure (e.g., user looks at various known reference points in an image and eye-tracking module 217 maps the locations of the user's pupil while looking at the reference points to corresponding signals received on the IR tracking array). As mentioned above, in some embodiments, system 200 may use other eye-tracking systems than the embedded IR one described herein.

Adjustment module 218 generates an image frame based on the determined locations of the pupils. In some embodiments, this sends a discrete image to the display that will tile sub-images together thus a coherent stitched image will appear on the back of the retina. Adjustment module 218 adjusts an output (i.e. the generated image frame) of electronic display 215 based on the detected locations of the pupils. Adjustment module 218 instructs portions of electronic display 215 to pass image light to the determined locations of the pupils. In some embodiments, adjustment module 218 also instructs the electronic display to not pass image light to positions other than the determined locations of the pupils. Adjustment module 218 may, for example, block and/or stop light emission devices whose image light falls outside of the determined pupil locations, allow other light emission devices to emit image light that falls within the determined pupil locations, translate and/or rotate one or more display elements, dynamically adjust curvature and/or refractive power of one or more active lenses in the lens (e.g., microlens) arrays, or some combination thereof.

Optional locators 220 are objects located in specific positions on display device 205 relative to one another and relative to a specific reference point on display device 205. A locator 220 may be a light emitting diode (LED), a corner cube reflector, a reflective marker, a type of light source that contrasts with an environment in which display device 205 operates, or some combination thereof. In embodiments where locators 220 are active (i.e., an LED or other type of light emitting device), locators 220 may emit light in the visible band (e.g., about 400 nm to 750 nm), in the infrared band (e.g., about 750 nm to 1 mm), in the ultraviolet band (about 100 nm to 400 nm), some other portion of the electromagnetic spectrum, or some combination thereof.

In some embodiments, locators 220 are located beneath an outer surface of display device 205, which is transparent to the wavelengths of light emitted or reflected by locators 220 or is thin enough to not substantially attenuate the light emitted or reflected by locators 220. Additionally, in some embodiments, the outer surface or other portions of display device 205 are opaque in the visible band of wavelengths of light. Thus, locators 220 may emit light in the IR band under an outer surface that is transparent in the IR band but opaque in the visible band.

IMU 230 is an electronic device that generates calibration data based on measurement signals received from one or more position sensors 225. Position sensor 225 generates one or more measurement signals in response to motion of display device 205. Examples of position sensors 225 include: one or more accelerometers, one or more gyroscopes, one or more magnetometers, another suitable type of sensor that detects motion, a type of sensor used for error correction of IMU 230, or some combination thereof. Position sensors 225 may be located external to IMU 230, internal to IMU 230, or some combination thereof.

Based on the one or more measurement signals from one or more position sensors 225, IMU 230 generates first calibration data indicating an estimated position of display device 205 relative to an initial position of display device 205. For example, position sensors 225 include multiple accelerometers to measure translational motion (forward/back, up/down, left/right) and multiple gyroscopes to measure rotational motion (e.g., pitch, yaw, roll). In some embodiments, IMU 230 rapidly samples the measurement signals and calculates the estimated position of display device 205 from the sampled data. For example, IMU 230 integrates the measurement signals received from the accelerometers over time to estimate a velocity vector and integrates the velocity vector over time to determine an estimated position of a reference point on display device 205. Alternatively, IMU 230 provides the sampled measurement signals to console 210, which determines the first calibration data. The reference point is a point that may be used to describe the position of display device 205. While the reference point may generally be defined as a point in space; however, in practice the reference point is defined as a point within display device 205 (e.g., a center of IMU 230).

In some embodiments, IMU 230 receives one or more calibration parameters from console 210. As further discussed below, the one or more calibration parameters are used to maintain tracking of display device 205. Based on a received calibration parameter, IMU 230 may adjust one or more IMU parameters (e.g., sample rate). In some embodiments, certain calibration parameters cause IMU 230 to update an initial position of the reference point so it corresponds to a next calibrated position of the reference point. Updating the initial position of the reference point as the next calibrated position of the reference point helps reduce accumulated error associated with the determined estimated position. The accumulated error, also referred to as drift error, causes the estimated position of the reference point to "drift" away from the actual position of the reference point over time.

Imaging device 235 generates calibration data in accordance with calibration parameters received from console 210. Calibration data includes one or more images showing observed positions of locators 220 that are detectable by imaging device 235. In some embodiments, imaging device 235 includes one or more still cameras, one or more video cameras, any other device capable of capturing images including one or more locators 220, or some combination thereof. Additionally, imaging device 235 may include one or more filters (e.g., used to increase signal to noise ratio). Imaging device 235 is configured to optionally detect light emitted or reflected from locators 220 in a field-of-view of imaging device 235. In embodiments where locators 220 include passive elements (e.g., a retroreflector), imaging device 235 may include a light source that illuminates some or all of locators 220, which retro-reflect the light toward the light source in imaging device 235. Second calibration data is communicated from imaging device 235 to console 210, and imaging device 235 receives one or more calibration parameters from console 210 to adjust one or more imaging parameters (e.g., focal length, focus, frame rate, ISO, sensor temperature, shutter speed, aperture, etc.).

In some embodiments, display device 205 includes one or more optical assemblies 260, which can include a single optical assembly 260 or multiple optical assemblies 260 (e.g., an optical assembly 260 for each eye of a user). In some embodiments, the one or more optical assemblies 260 receive image light for the computer generated images from the electronic display 215 and direct the image light toward an eye or eyes of a user. The computer-generated images include still images, animated images, and/or a combination thereof. The computer-generated images include objects that appear to be two-dimensional and/or three-dimensional objects.

In some embodiments, electronic display 215 projects computer-generated images to one or more reflective elements (not shown), and the one or more optical assemblies 260 receive the image light from the one or more reflective elements and direct the image light to the eye(s) of the user. In some embodiments, the one or more reflective elements are partially transparent (e.g., the one or more reflective elements have a transmittance of at least 15%, 20%, 25%, 30%, 35%, 40%, 45%, or 50%), which allows transmission of ambient light. In such embodiments, computer-generated images projected by electronic display 215 are superimposed with the transmitted ambient light (e.g., transmitted ambient image) to provide augmented reality images.

Input interface 240 is a device that allows a user to send action requests to console 210. An action request is a request to perform a particular action. For example, an action request may be to start or end an application or to perform a particular action within the application. Input interface 240 may include one or more input devices. Example input devices include: a keyboard, a mouse, a game controller, data from brain signals, data from other parts of the human body, or any other suitable device for receiving action requests and communicating the received action requests to console 210. An action request received by input interface 240 is communicated to console 210, which performs an action corresponding to the action request. In some embodiments, input interface 240 may provide haptic feedback to the user in accordance with instructions received from console 210. For example, haptic feedback is provided when an action request is received, or console 210 communicates instructions to input interface 240 causing input interface 240 to generate haptic feedback when console 210 performs an action.

Console 210 provides media to display device 205 for presentation to the user in accordance with information received from one or more of: imaging device 235, display device 205, and input interface 240. In the example shown in FIG. 2, console 210 includes application store 245, tracking module 250, and application engine 255. Some embodiments of console 210 have different modules than those described in conjunction with FIG. 2. Similarly, the functions further described herein may be distributed among components of console 210 in a different manner than is described here.

When application store 245 is included in console 210, application store 245 stores one or more applications for execution by console 210. An application is a group of instructions, that when executed by a processor, is used for generating content for presentation to the user. Content generated by the processor based on an application may be in response to inputs received from the user via movement of display device 205 or input interface 240. Examples of applications include: gaming applications, conferencing applications, video playback application, or other suitable applications.

When tracking module 250 is included in console 210, tracking module 250 calibrates system 200 using one or more calibration parameters and may adjust one or more calibration parameters to reduce error in determination of the position of display device 205. For example, tracking module 250 adjusts the focus of imaging device 235 to obtain a more accurate position for observed locators on display device 205. Moreover, calibration performed by tracking module 250 also accounts for information received from IMU 230. Additionally, if tracking of display device 205 is lost (e.g., imaging device 235 loses line of sight of at least a threshold number of locators 220), tracking module 250 re-calibrates some or all of system 200.

In some embodiments, tracking module 250 tracks movements of display device 205 using second calibration data from imaging device 235. For example, tracking module 250 determines positions of a reference point of display device 205 using observed locators from the second calibration data and a model of display device 205. In some embodiments, tracking module 250 also determines positions of a reference point of display device 205 using position information from the first calibration data. Additionally, in some embodiments, tracking module 250 may use portions of the first calibration data, the second calibration data, or some combination thereof, to predict a future location of display device 205. Tracking module 250 provides the estimated or predicted future position of display device 205 to application engine 255.

Application engine 255 executes applications within system 200 and receives position information, acceleration information, velocity information, predicted future positions, or some combination thereof of display device 205 from tracking module 250. Based on the received information, application engine 255 determines content to provide to display device 205 for presentation to the user. For example, if the received information indicates that the user has looked to the left, application engine 255 generates content for display device 205 that mirrors the user's movement in an augmented environment. Additionally, application engine 255 performs an action within an application executing on console 210 in response to an action request received from input interface 240 and provides feedback to the user that the action was performed. The provided feedback may be visual or audible feedback via display device 205 or haptic feedback via input interface 240.

Figure 3A:
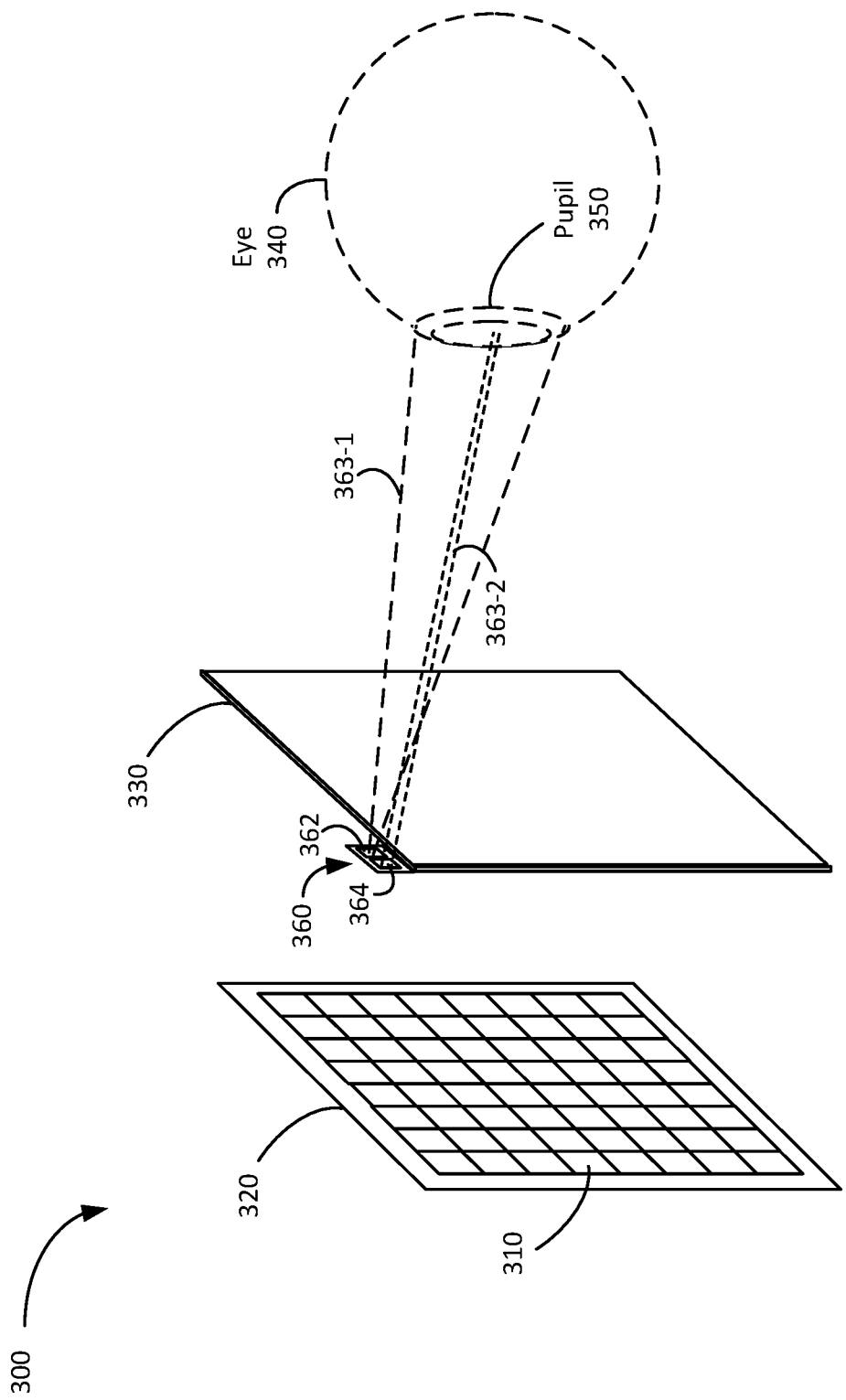
FIG. 3A is an isometric view of a display device in accordance with some embodiments.

FIG. 3A is an isometric view of a display device 300, which corresponds to part of or all of display device 100 (see FIG. 1) in accordance with some embodiments. In some embodiments, display device 300 includes a display 310 (e.g., a light emission device array), an optical assembly (e.g., optical assembly 260) having one or more optical components 330 (e.g., one or more of lenses), and an eye-tracking device 360 (e.g., an eye-tracking device included in, or in communication with, eye-tracking module 217).

In some embodiments, display 310 emits image light. Display 310 may be, e.g., an array of LEDs, an array of microLEDs, an array of OLEDs, or some combination thereof. Display 310 includes light emission devices 320 that emit light in the visible light.

In some embodiments, display device 300 includes an emission intensity array configured to selectively attenuate light emitted from display 310. In some embodiments, the emission intensity array is composed of a plurality of liquid crystal cells or pixels, groups of light emission devices, or some combination thereof. Each of the liquid crystal cells is, or in some embodiments, groups of liquid crystal cells are, addressable to have specific levels of attenuation. For example, at a given time, some of the liquid crystal cells may be set to no attenuation, while other liquid crystal cells may be set to maximum attenuation. In this manner, the emission intensity array is able to control what portion of the image light emitted from display 310 is passed to the one or more optical components 330. In some embodiments, display device 300 uses an emission intensity array to facilitate providing image light to a location of pupil 350 of eye 340 of a user, and minimize the amount of image light provided to other areas in the eyebox.

In some embodiments, display 310 and an emission intensity array make up a display element. Alternatively, the display element includes display 310 (e.g., when display 310 includes individually adjustable pixels) without the emission intensity array. In some embodiments, in response to a determined location of pupil 350, the display element adjusts the emitted image light such that the light output by the display element is refracted by one or more optical components 330 toward the determined location of pupil 350, and not toward another presumed location.

In some embodiments, display device 300 includes one or more broadband sources (e.g., one or more white LEDs) coupled with a plurality of color filters, in addition to, or instead of, display 310.

One or more optical components 330 receive the image light (or modified image light, e.g., attenuated light) from display 310, and direct the image light to a detected or presumed location of the pupil 350 of an eye 340 of a user. In some embodiments, the one or more optical components include one or more optical assemblies 260.

Eye-tracking device 360 includes light source structure 362 configured to output light 363-1 (e.g., infrared (IR) light) toward eye 340, and photodetector 364 configured to receive light 363-2 that has been retro-reflected from the retina of eye 340, cornea of eye 340, crystalline lens of eye 340, and/or other parts of the eye 340. In some embodiments, eye-tracking device 360 is disposed proximate to display 310 and/or optical assembly (e.g., optical assembly 260) with one or more optical components 330. In some embodiments, eye-tracking device 360 is coupled with display 310 and/or with one or more optical components 330. In some embodiments, eye-tracking device 360 is integrated into display 310 and/or with one or more optical components 330. Photodetector 364 includes either a single IR sensor or a plurality of IR sensitive detectors (e.g., photodiodes).

Figure 3B:
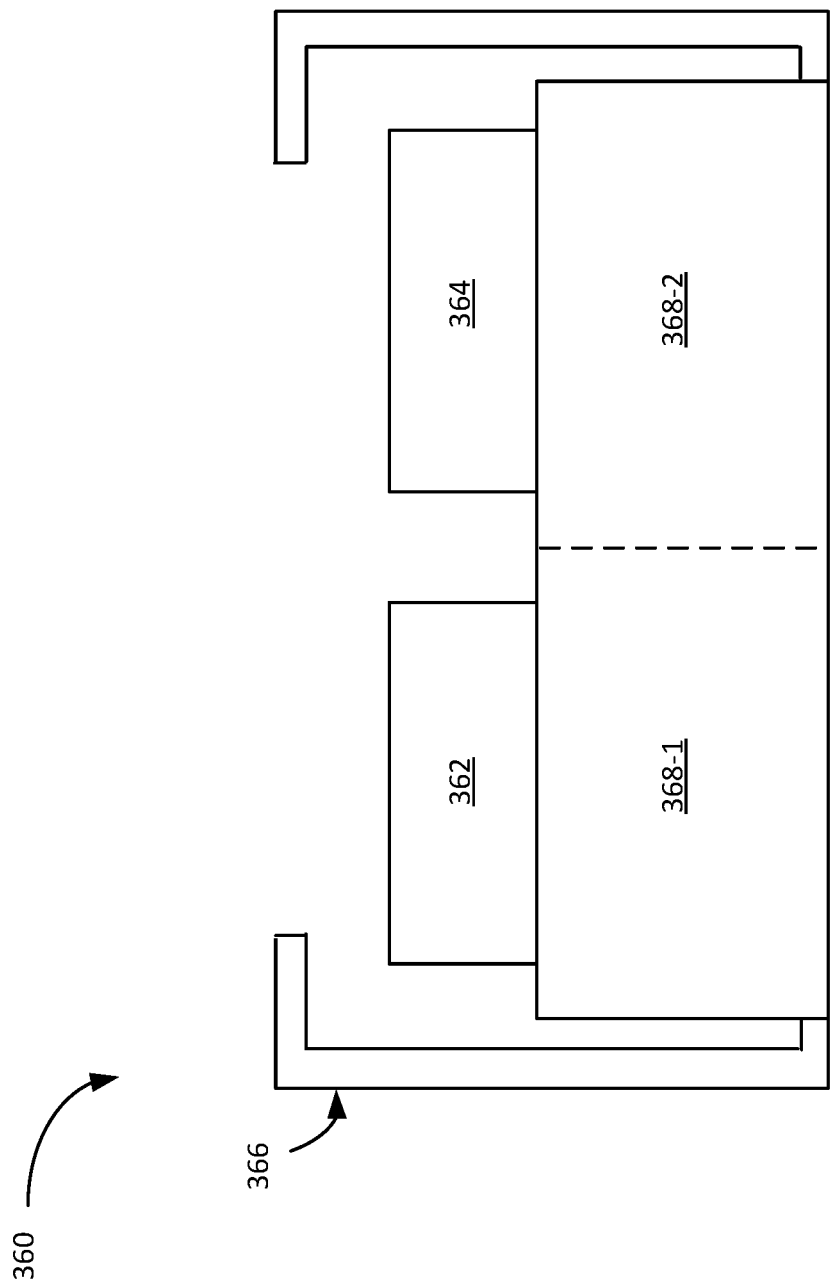
FIG. 3B is a schematic diagram illustrating an eye-tracking device in accordance with some embodiments.

FIG. 3B is a schematic diagram illustrating eye-tracking device 360 in accordance with some embodiments. Eye-tracking device 360 is configured for determining a position of an eye of a user of a head-mounted display device (e.g., pupil 350 of eye 340 in FIG. 3A). Eye-tracking device 360 is included in, or is in communication with, eye-tracking module 217 described with respect to FIG. 2. As described above, eye-tracking device 360 includes light source structure 362 configured to project light (e.g., light 363-1) to an eye of a user (e.g., eye 340). Light 363-1 is in the IR range and therefore invisible to the user. Eye-tracking device 360 also includes photodetector 364 configured to receive the light (e.g., light 363-2) reflected off the eye of the user. In some embodiments, photodetector 364 includes either a single IR sensor or a plurality of IR sensors (e.g., photodiodes or other IR sensitive detectors). As shown, light source structure 362 and photodetector 364 are integrated to form a single unit. In some embodiments, the eye-tracking device 360 includes housing 366 that partially encloses light source structure 362 and photodetector 364. In some embodiments, light source structure 362 and photodetector 364 are formed on separate substrates that are positioned adjacent to each other (e.g. substrates 368-1 and 368-2 separated by a dash line in FIG. 3B). In some embodiments, light source structure 363 and photodetector 364 are formed on a common substrate (e.g., substrates 368-1 and 368-2 are parts or portions of a common uniform substrate).

Figure 4A:
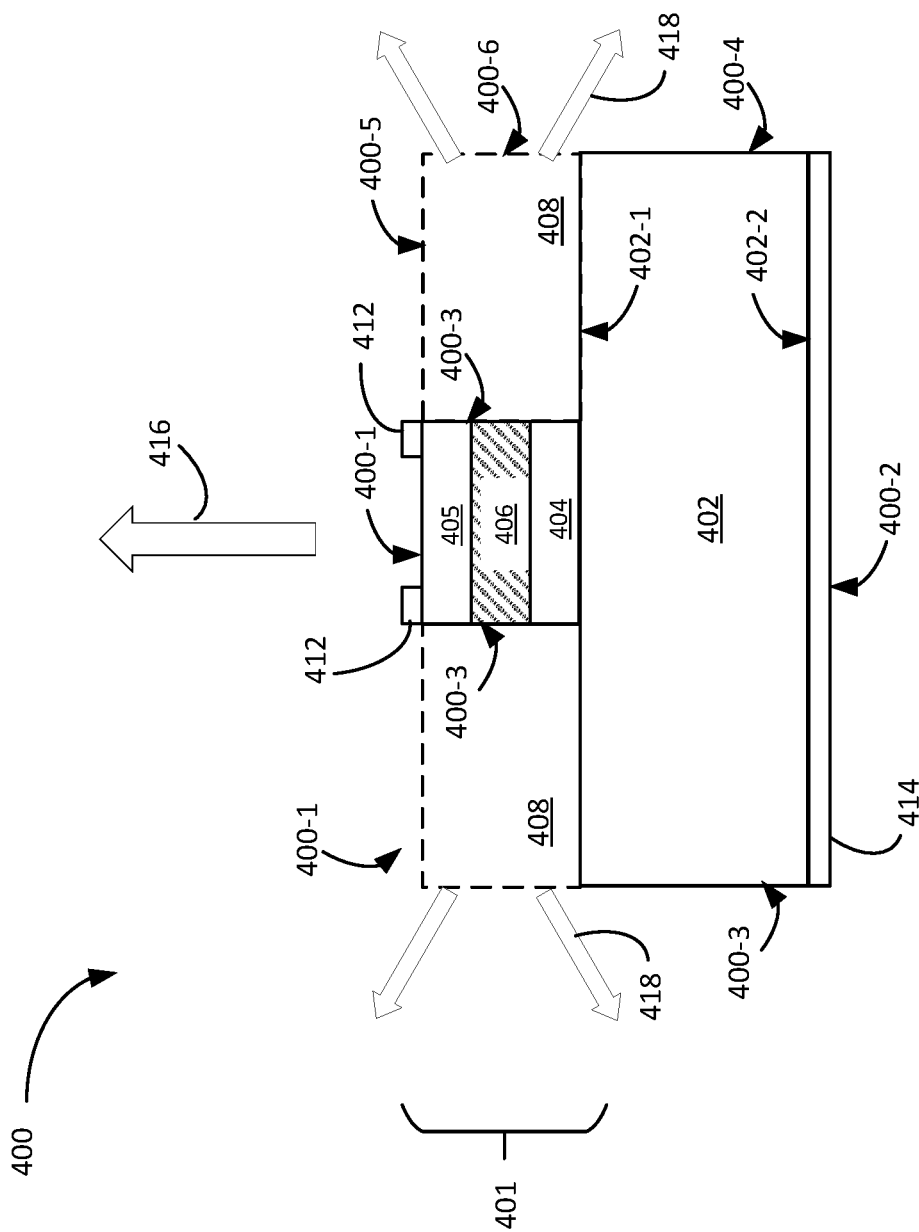
FIG. 4A is a schematic diagram illustrating a cross-sectional view of an exemplary vertical cavity surface-emitting laser (VCSEL) device outputting stimulated directional emission and spontaneous emission, in accordance with some embodiments.

FIG. 4A is a schematic diagram illustrating a cross-sectional view of vertical cavity surface-emitting laser (VCSEL) 400 outputting stimulated directional emission and spontaneous emission, in accordance with some embodiments. VCSEL 400 includes substrate 402, a top portion 401 of VCSEL 400 (e.g., a light emitting portion of VCSEL 400) disposed on substrate 402, two or more contacts (e.g., top contact 412 and bottom contact 414) and optional wall layer 408.

Top portion 401 includes a pair of distributed Bragg reflectors (DBR) 404 (e.g., an n-type DBR) and 405 (e.g., a p-type DBR), and an active layer 406 sandwiched between DBRs 404 and 405. DBRs 404 and 405 include doped (e.g., as p-type and n-type) semiconducting material (e.g., gallium arsenide (GaAs) and/or aluminum gallium arsenide ($Al_xGa_{(1-x)}As$). In some embodiments, DBRs 404 and 405 each include a plurality of layers made of $Al_xGa_{(1-x)}As$ having a varying concentration of aluminum. Active layer 406 includes one or more quantum wells and, in some embodiments, one or more cladding layers. Active layer 406 includes undoped semiconducting material (e.g., undoped GaAs, $Al_xGa_{(1-x)}As$, indium gallium arsenide (InGaAs), or gallium nitride (GaN)). For example, in some embodiments, DBRs 404 and 405 include n- and p-doped $Al_xGa_{(1-x)}As$ and active layer 406 includes undoped $Al_xGa_{(1-x)}As$.

DBRs 404 and 405 are disposed on substrate 402 such that the reflectors are parallel to surface 402-1 of substrate 402. Substrate 402 is made of a semiconductor material (e.g., GaAs, silicon, or sapphire). Contacts 412 and 414 are made of metal (e.g., gold, silver, copper, aluminum, chromium, tungsten or any alloy thereof). As shown, in some embodiments, top portion 401 of VCSEL 400 is disposed on surface 402-1 of substrate 402 and bottom contact 414 (e.g., an n-type contact) is disposed on second surface 402-2 of substrate 402 opposite to first surface 402-1. Top contact 412 (e.g., a p-type contact) is positioned in contact with top surface 400-1 of VCSEL 400. In some embodiments, contact 414 and/or contact 412 may be positioned differently. For example, contact 414 and/or contact 412 may be disposed adjacent different layers of VCSEL 400.

In some embodiments, VCSEL 400 also includes wall layer 408 surrounding top portion 401 of VCSEL 400 including the pair of DBRs 404 and 405 and active layer 406 on substrate 402. In some embodiments, wall layer 408 includes a same material as substrate 402 or a same material as a material in DBRs 404 and 405 and/or active layer 406 (e.g., GaAs or $Al_xGa_{(1-x)}As$, or a combination thereof).

Top portion 401 of VCSEL 400 has a top surface 400-1, and side surface 400-3. Substrate 402 has surface 400-2 that is opposite to top surface 400-1. Side surface 400-3 is substantially perpendicular to, and adjoining, top surface 400-1. In some embodiments, top surface 400-1 of VCSEL 400 has a circular shape (e.g., as described below with respect to FIG. 5F), elliptical shape, rectangular shape, square shape, or free form shape. In some embodiments, when VCSEL 400 also includes wall layer 408, top surface 400-1 and top surface 400-5 of wall layer 408 together form a top surface of VCSEL 400. In some embodiments, side surface 400-4 of substrate 402 and a side surface 400-6 of wall layer 408 together form a side surface of VCSEL 400.

VCSEL 400 is configured to output stimulated directional emission of light through top surface 400-1, as indicated with arrow 416 in FIG. 4A. Additionally, VCSEL 400 may output spontaneous emission of light through side surfaces 400-3. An intensity of spontaneous emission of light may be, for example, about 1% of an intensity of the stimulated directional emission of light. In an eye-tracking device, such as eye-tracking device 360 described with respect to FIGS. 3A-3B, the spontaneous emission of light indicated with arrows 418 emitted through side surfaces 400-3, could be detected by photodetector 364. The spontaneous emission thus increases a baseline light intensity (e.g., noise) detected by photodetector 364, thereby reducing a signal to noise ratio for detecting light 363-2 reflected off eye 340, as illustrated in FIG. 3A. Therefore, there is a need for light source structures with reduced or negligible spontaneous emission received by photodetector without significantly increasing a distance between the VCSEL and photodetector, and an overall size of eye-tracking device 360.

VCSEL 400 in FIG. 4A is an exemplary configuration for a VCSEL. It is understood that a VCSEL used according to some embodiments could have any configuration or structure known in the art.

Figure 4D:
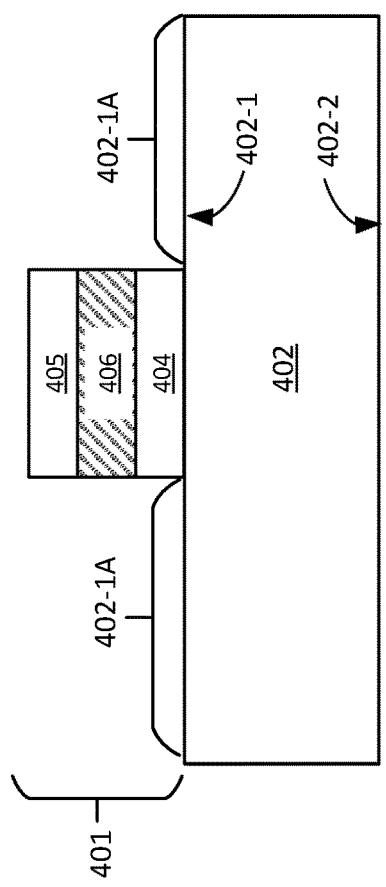
FIGS. 4B-4F are schematic diagrams illustrating a method of fabricating the VCSEL device of FIG. 4A, in accordance with some embodiments.
Figure 4E:
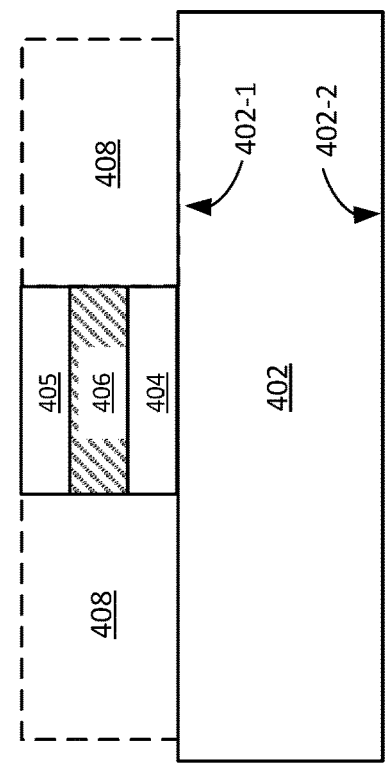
Figure 4B:
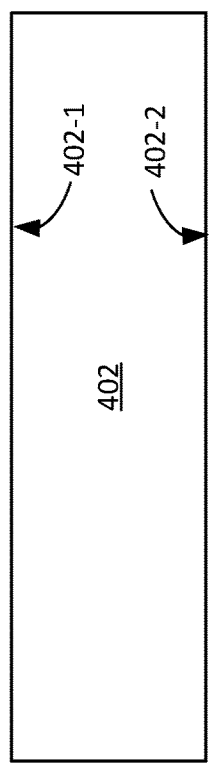

FIGS. 4B-4F are schematic diagrams illustrating a method of fabricating VCSEL 400 on substrate 402, in accordance with some embodiments. In FIG. 4B, a substrate 402, e.g., GaAs, silicon, or sapphire GaAs substrate, is provided. In some embodiments, GaAs is a desirable material for substrate 402 because GaAs facilitates subsequent epitaxial growth of additional layers of GaAs or GaAs derivatives, such as doped and undoped layers of $Al_xGa_{(1-x)}As$ used for DBRs 404 and 405 and active layer 406.

Figure 4C:
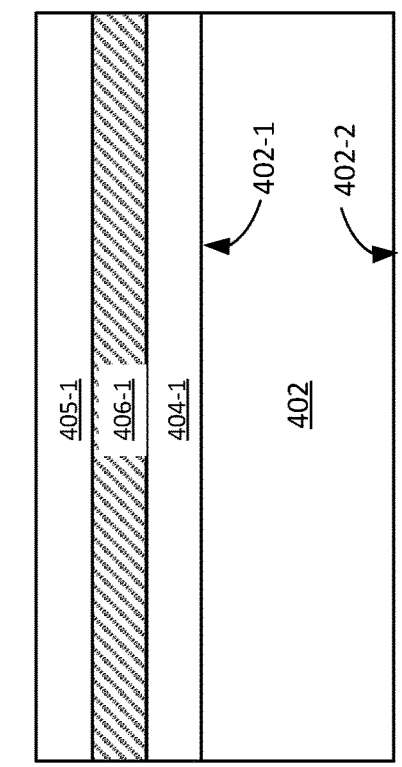

In FIG. 4C, DBR layer 404-1, active layer 406-1, and DBR layer 405-1 are deposited on surface 402-1 of substrate 402 using any suitable deposition processes known in the art, such as molecular beam epitaxy, metal-organic-chemical vapor deposition (MOCVD), or chemical beam epitaxy (CBE). In some embodiments, depositing of DBR layer 404-1 includes depositing a plurality of epitaxial layers of semiconductor materials having an n-type doping (e.g., n-type layers of GaAs and $Al_xGa_{(1-x)}As$) on surface 402-1 of substrate 402. In some embodiments, the plurality of epitaxial layers include $Al_xGa_{(1-x)}As$ with varying concentration of aluminum. The depositing of DBR layer 404-1 is done so that DBR 404 is in direct contact with surface 402-1 of substrate 402. Subsequent to forming DBR layer 404-1, active layer 406-1 (e.g., a layer of undoped GaAs, $Al_xGa_{(1-x)}As$, indium gallium arsenide (InGaAs), or gallium nitride (GaN)) is deposited on DBR 404-1 so that active layer 406-1 is in direct contact with DBR 404-1. Subsequent to depositing active layer 406-1, DBR layer 405-1 is deposited on active layer 406-1 such that DBR 405-1 is in direct contact with active layer 406-1.

In FIG. 4D, the structure of FIG. 4C is etched to form top portion 401 of VCSEL 400 with a desired shape and size. The etching can be done by reactive ion etching (e.g., fluorine based or chlorine based dry etching) or any other dry etching method known in the art. In FIG. 4D, portions of substrate 402 (e.g., portion 402-1A of surface 402-1 of substrate 402 surrounding top portion 401 of VCSEL 400) have been exposed by the etching. In some embodiments, the etching is performed so that substrate 402 is not exposed (i.e., only a portion of DBR layer 404-1 is removed by etching).

Figure 4F:
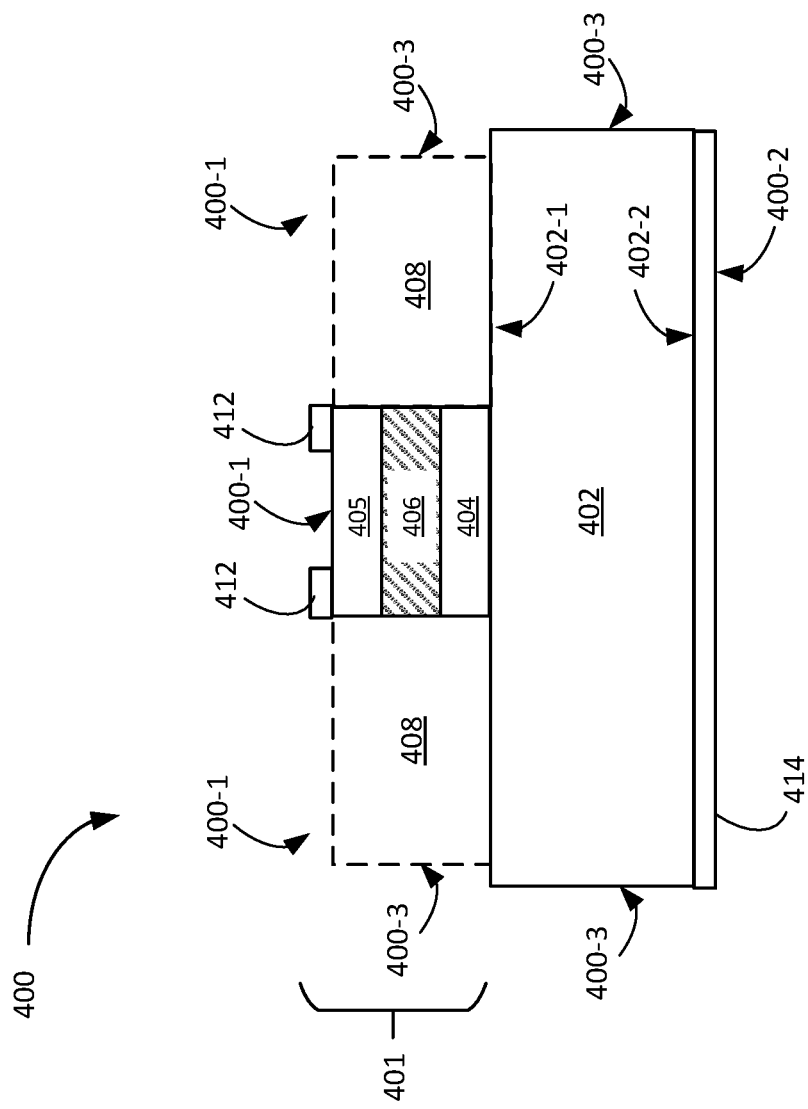

In some embodiments, method of fabricating VCSEL 400 further includes depositing wall layer 408 on portions of substrate 402 that have been exposed during etching (e.g., portion 402-1A) described with respect to FIG. 4D, as shown in FIG. 4E. As described above, in some embodiments, wall layer 408 is made of the same material as substrate 402 (e.g., wall layer 408 is part of substrate 402 and DBRs 404 and 405 and active layer 406 are at least partially embedded in substrate 402/wall layer 408). In some embodiments, wall layer is made of the same material as a material in DBRs 404 and 405 (e.g., GaAs or $Al_xGa_{(1-x)}As$). In FIG. 4F, top contact 412 and bottom contact 414 have been formed on surface 402-2 of substrate 402 and top surface 400-1 of VCSEL 400, respectively (e.g., by sputtering, metal evaporation, or any other metal deposition process known in the art, and dry etching). As described above, top contact 412 and bottom contact 414 are made of metal (e.g., gold, silver, copper, aluminum, tungsten or any alloy thereof).

Figure 5A:
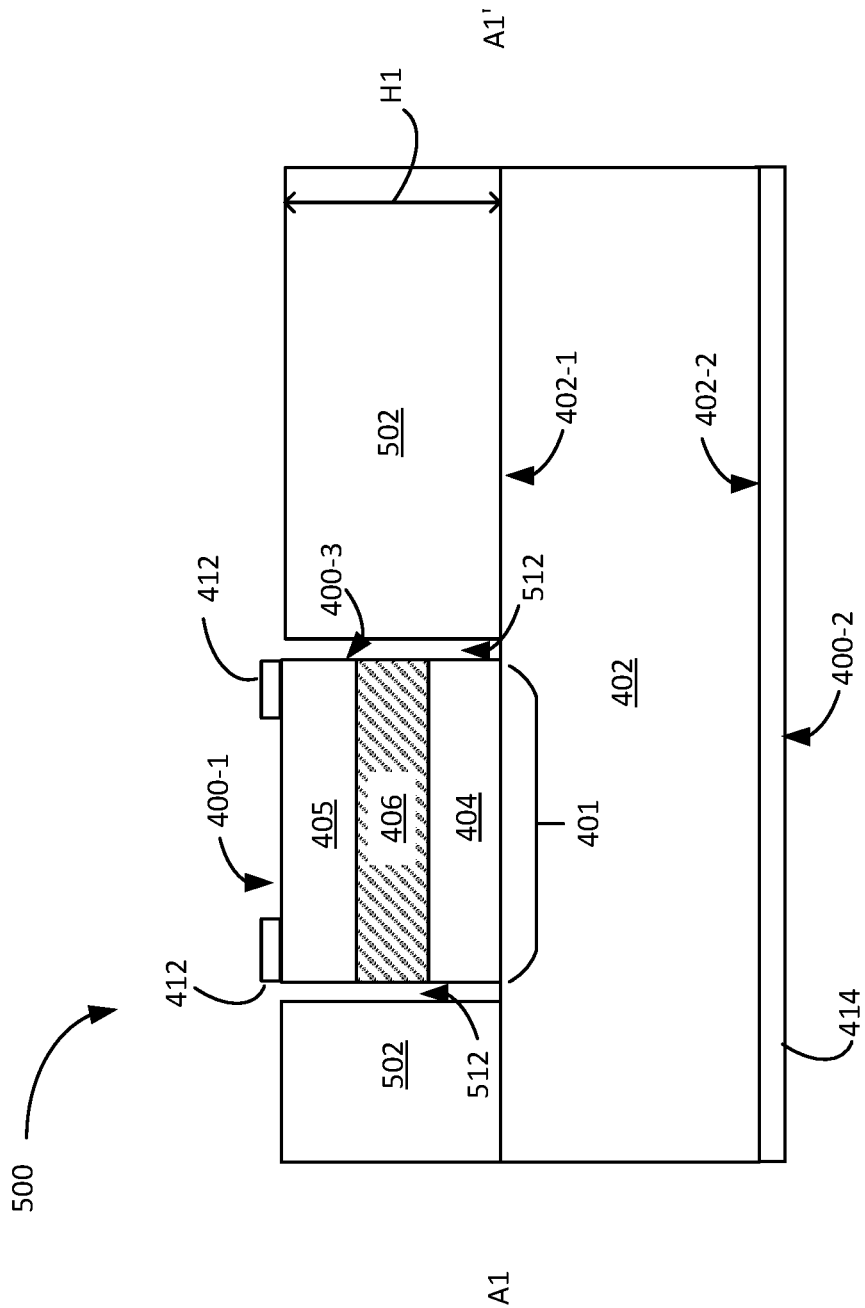
FIG. 5A is a schematic diagram illustrating a cross-sectional view of a light source structure, in accordance with some embodiments.

FIG. 5A is a schematic diagram illustrating a cross-sectional view of light source structure 500, in accordance with some embodiments. The cross-sectional view is illustrated along reference line AA' shown in FIG. 5F. Light source structure 500 includes VCSEL 400 described above with respect to FIG. 4A. As described above, top portion 401 of VCSEL 400 includes distributed Bragg reflectors (DBR) 404 (e.g., an n-type DBR) and 405 (e.g., a p-type DBR) and active layer 406 sandwiched between DBRs 404 and 405 disposed on substrate 402. Light source structure 500 further includes light barrier 502 surrounding top portion 401 of VCSEL 400. Light barrier 502 is configured to receive and absorb spontaneous emission of light output by VCSEL 400 through side surfaces 400-3 (e.g., spontaneous emission of light indicated with arrows 418 in FIG. 4A). Light barrier 502 and top portion 401 of VCSEL 400 are both disposed on substrate 402. In some embodiments, light barrier 502 and top portion 401 of VCSEL 400 have about the same height (e.g., height H1) extending from top surface 402-1 of substrate 402 to top surfaces of light barrier 502 and DBR 405.

In some embodiments, light barrier 502 includes metal (e.g., gold or chromium). In such embodiments, light barrier 502 is further configured to act as a top contact for VCSEL 400 and top contact 412 may be excluded from VCSEL 400. In some embodiments, light barrier 502 includes black matrix material, such as resin including black pigment. In such embodiments, light source structure 500 further includes top contact 412 (as illustrated with a dashed line in FIG. 5A). Light barrier 502 is separated from side surfaces 400-3 of VCSEL 400 by a distance, as illustrated by gap 512. In some embodiments, gap 512 is an air gap. In some embodiments, gap 512 includes dielectric material (e.g., oxidized $Al_xGa_{(1-x)}As$).

Figure 5B:
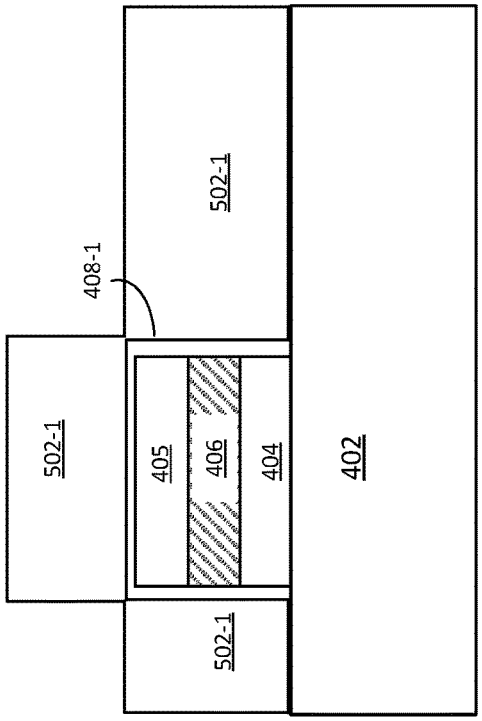
FIGS. 5B-5E are schematic diagrams illustrating a method of fabricating the light source structure of FIG. 5A, in accordance with some embodiments.
Figure 5C:
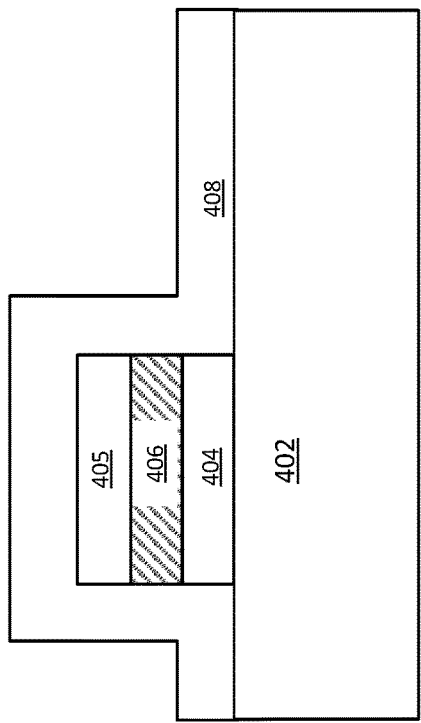
Figure 5D:
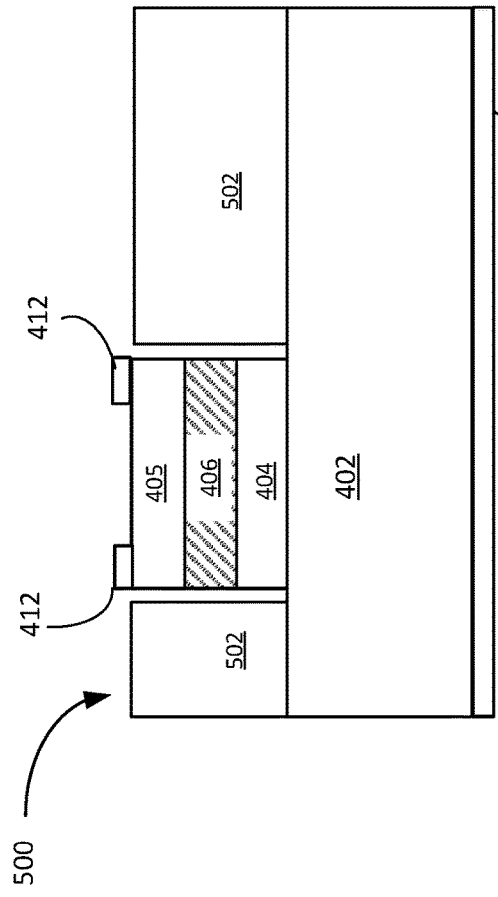

FIGS. 5B-5E are schematic diagrams illustrating a method of fabricating light source structure 500, in accordance with some embodiments. In FIG. 5B, VCSEL described above with respect to FIG. 4D is obtained, and sacrificial layer 508 (e.g., a photoresist) is deposited over VCSEL 400 and substrate 402 one or more processes known in the art. In FIG. 5C, portions of sacrificial layer 508 on surface 402-1 of substrate 402 are removed (e.g., by ion etching or any other dry etching method known in the art) such that portion 508-1 of sacrificial layer 508 positioned on DBR 405 of VCSEL 400 remains. In FIG. 5D, a layer of light barrier 502-1 is deposited over the structure of FIG. 5C, such that the layer of light barrier 502-1 extends over surface 402-1 of substrate 402, and portion 408-1 of sacrificial layer 408. As described above, in some embodiments, light barrier 502 is made of metal (e.g., gold or chromium) and deposition of light barrier 502 includes metal deposition methods known in the art (e.g., by sputtering or evaporation methods). In some embodiments, light barrier 502 is made of black matrix material. In such embodiments, deposition of black matrix material includes ink jet printing, spin coating, or other resin deposition methods known in the art.

Figure 5E:
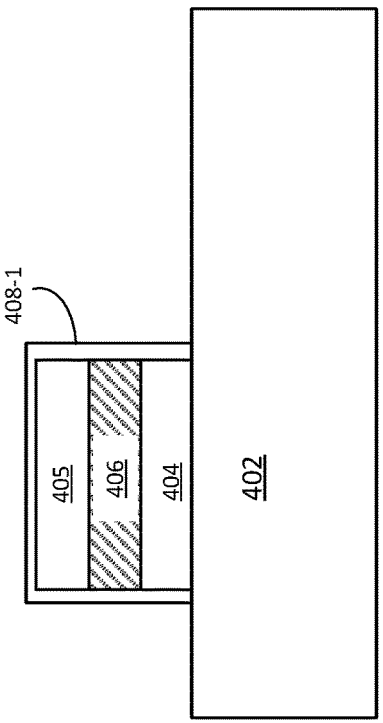

In FIG. 5E, portion 508-1 of sacrificial layer 508 on top of DBR 405, together with a portion of light barrier layer 502-1 disposed on portion 508-1 of sacrificial layer 508 is removed (e.g., lifted off), resulting in the formation of light barrier 502 surrounding top portion 401 of VCSEL 400, as shown. In some embodiments, removing portion 508-1 of sacrificial layer 508 on top of DBR 405, together with a portion of light barrier layer 502-1 disposed on portion 508-1 of sacrificial layer 508, is done by wet chemical etching of portion 508-1 of sacrificial layer 508 or by mechanical processes (e.g., by chemical mechanical polishing of the barrier layer 502-1). In FIG. 5E, bottom contact 414 and optional top contact 412 are added to form light source structure 500.

In some embodiments, light barrier 502 is deposited on VCSEL described with respect to FIG. 4D directly, without deposition of sacrificial layer 508. In such embodiments, the deposition includes lithographic processes applying masking for forming patterns (e.g., by photolithography or X-ray lithography). In some embodiments, light barrier 502 is deposited on VCSEL described with respect to FIG. 4D by patterned ink jet printing so that light barrier 502 is only applied to portions of surface 402-1 of substrate 402 and is not applied on top portion 401 of VCSEL 400.

Figure 5F:
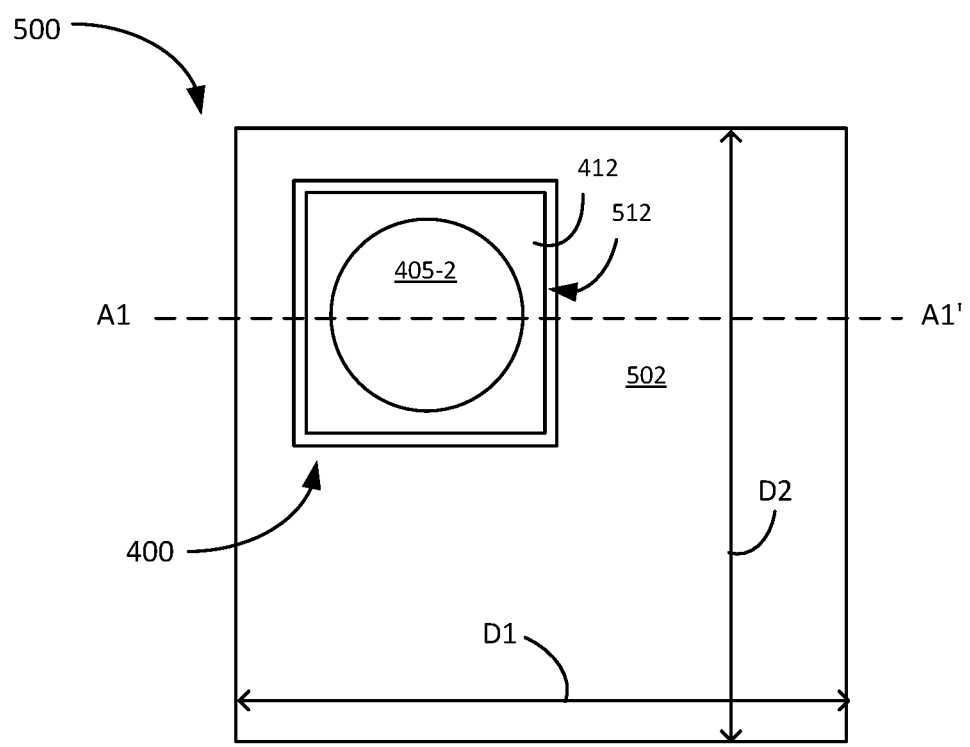
FIG. 5F is a schematic diagram illustrating a top view of the light source structure of FIG. 5A, in accordance with some embodiments.

FIG. 5F is a schematic diagram illustrating a top view of light source structure 500, in accordance with some embodiments. As shown, light source structure 500 includes top surface 400-1 of VCSEL, gap 512, and light barrier 502. In some embodiments, exposed surface 405-2 of an exposed portion of top surface 400-1 of VCSEL 400 (e.g., an exposed surface of DBR 405) has a circular shape and a top surface of light source structure 500 has an overall square shape, as shown. In some embodiments, exposed surface 405-2 of top surface 400-1 of VCSEL 400 has an elliptical shape, rectangular shape, square shape, other polynomial shape or a free form shape. In some embodiments, the top surface of light source structure is elliptical shape, rectangular shape, square shape, other polynomial shape or a free form shape. In some embodiments, the light source structure has at least one dimension (e.g., dimension D1 or D2 in FIG. 5F) ranging from 100 micrometer to 200 micrometer. In some embodiments, the light structure has at least one dimension ranging from 100 micrometer to 175 micrometer, 100 micrometer to 150 micrometer, or 100 micrometer to 125 micrometer. In some embodiments, the light structure has at least one dimension of 100 micrometer, 110 micrometer, 120 micrometer, 130 micrometer, 140 micrometer, 150 micrometer, 160 micrometer, 170 micrometer, 180 micrometer, 190 micrometer, or 160 micrometer. In some embodiments, the light source structure has a top surface area ranging from 100×100 micrometers to 200×200 micrometers. In some embodiments, the light source structure has a top surface area of 100×100 micrometer, 110×110 micrometer, 120×120 micrometers, 130×130 micrometers, 140×140 micrometer, 150×150 micrometer, 160×160 micrometer, 170×170 micrometer, 180×180 micrometer, 190×190 micrometer, or 200×200 micrometer. In some embodiments, the light source structure has a circular shape or elliptical shape. In some embodiments, a diameter or an axis of a circle or an ellipse, respectively, is 100 micrometer, 110 micrometer, 120 micrometer, 130 micrometer, 140 micrometer, 150 micrometer, 160 micrometer, 170 micrometer, 180 micrometer, 190 micrometer, or 200 micrometer. As illustrated by the dimensions of FIG. 5F, light source structure 500 has a size comparable to a size of a VCSEL structure (e.g., VCSEL 400 in FIG. 4A). With such compact size, light source structure 500 is suitable for eye-tracking devices used in head-mounted display devices.

Figure 6A:
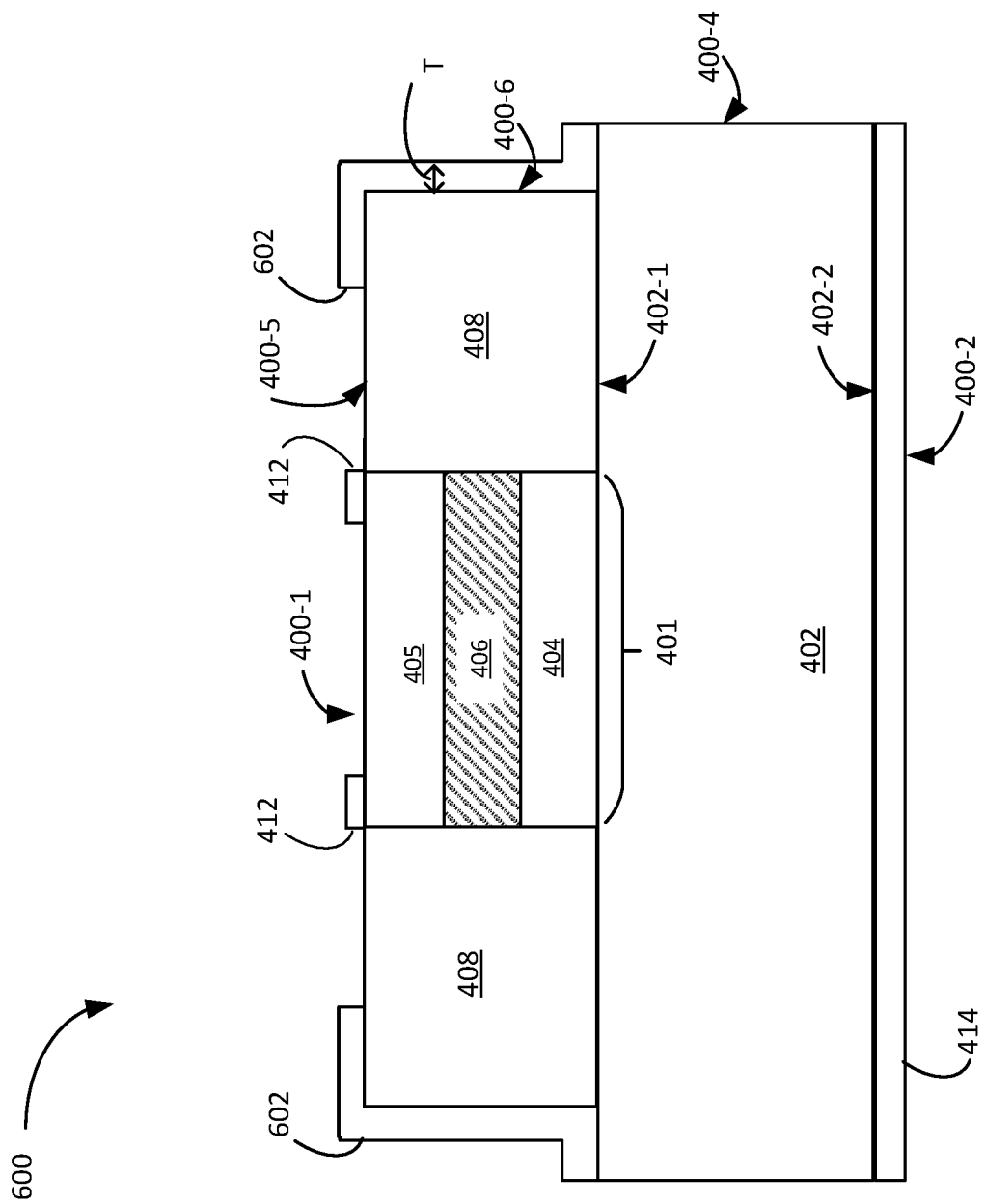
FIG. 6A is a schematic diagram illustrating a cross-sectional view of a light source structure, in accordance with some embodiments.

FIG. 6A is a schematic diagram illustrating a cross-sectional view of light source structure 600, in accordance with some embodiments. Light source structure 600 includes VCSEL 400 including top portion 401 of VCSEL 400 and wall layer 408 disposed on substrate 402, as described with respect to FIG. 4A. Light source structure 600 further includes light barrier 602. Light barrier 602 partially surrounds wall layer 408 such that wall layer 408 is disposed between top portion 401 of VCSEL 400 and light barrier 602. In some embodiments, light barrier 602 covers side surface 400-6 of wall layer and extends to partially cover top surface 400-5 of wall layer. In some embodiments, light barrier 602 extends to partially cover exposed portions of top surface 402-1 of substrate. In some embodiments, light barrier 602 has a thickness (e.g., thickness T) ranging from two micrometers to ten micrometers. In some embodiments, thickness T is ranging from two micrometers to three micrometers, from two micrometers to four micrometers, from two micrometers to five micrometers, or from two micrometers to ten micrometers. In some embodiments, thickness T is less than 10 micrometers, less than nine micrometers, less than eight micrometers, less than seven micrometers, less than six micrometers, less than five micrometers, less than four micrometers, or less than three micrometers.

FIGS. 6B-6E are schematic diagrams illustrating a method of fabricating light source structure 600, in accordance with some embodiments. In FIG. 6B, VCSEL structure described above with respect to FIG. 4E is obtained including wall layer 408 deposited on portions of surface 402-1 of substrate 402. In FIG. 6C, bottom contact 414 is deposited on surface 402-2 of substrate 402, and top contact 412 is deposited on top surface 400-1 of VCSEL 400. In some embodiments, top contact 412 partially covers DBR 405.

In FIG. 6D, light barrier layer 602-1 is deposited to cover exposed portions of surface 402-1 of substrate 402, top surface 400-6 and side surface 400-6 of wall layer 408, and top surface 400-1 of DBR 405. In FIG. 6E, a portion of light barrier layer 602-1 is etched away (e.g., by photolithography, reactive ion etching or any dry etching technique known in the art) to form light barrier 602. As shown in FIG. 6E, light barrier 602 covers side surface 400-6 of wall layer 408 and extends partially over the top surface 400-5 of wall layer 408. In some embodiments, light barrier 602 may cover portions of surface 402-1 of substrate 402.

In some embodiments, deposition of light barrier 602 includes processes discussed above with respect to deposition of light barrier 502 (e.g., FIGS. 5B-5E).

Figure 7A:
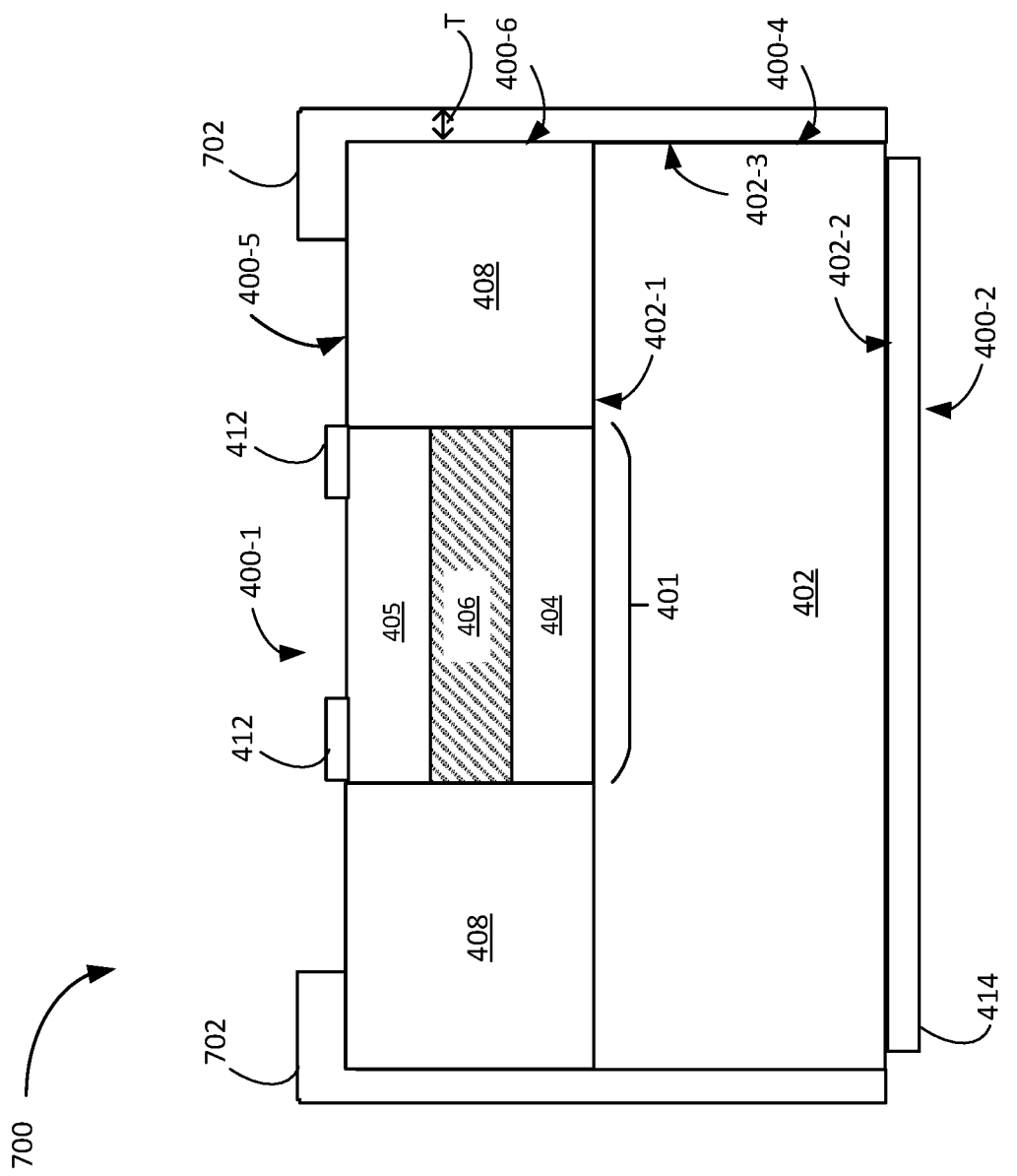
FIG. 7A is a schematic diagram illustrating a cross-sectional view of a light source structure, in accordance with some embodiments.

FIG. 7A is a schematic diagram illustrating a cross-sectional view of light source structure 700 including light barrier 702, in accordance with some embodiments. Light source structure 700 corresponds to light source structure 600 described above with respect to FIG. 6A, except that in light source structure 700 wall layer 408 extends over surface 402-1 of substrate 402 such that side surface 400-6 of wall layer 408 is substantially aligned with side surface 400-4 of substrate, and that light barrier 702 (corresponding to light barrier 602 in FIG. 6A) extends along side surface 400-4 and side surface 400-6 and partially over top surface 400-5 of wall layer 408. Additionally, bottom contact 414 extends only partially over surface 402-2 of substrate 402 so that light barrier 702 and bottom contact 414 are not in direct contact with each other.

Figure 7D:
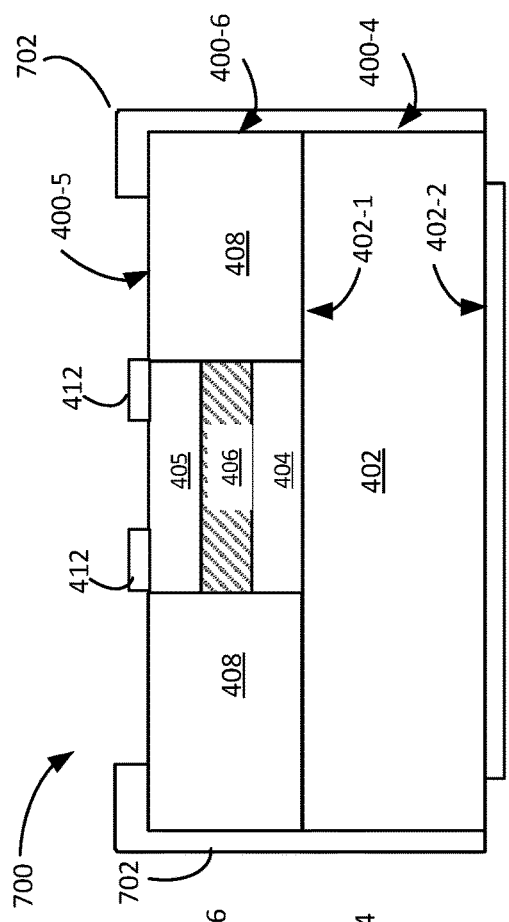
FIGS. 7B-7D are schematic diagrams illustrating a method of fabricating the light source structure of FIG. 7A, in accordance with some embodiments.
Figure 7B:
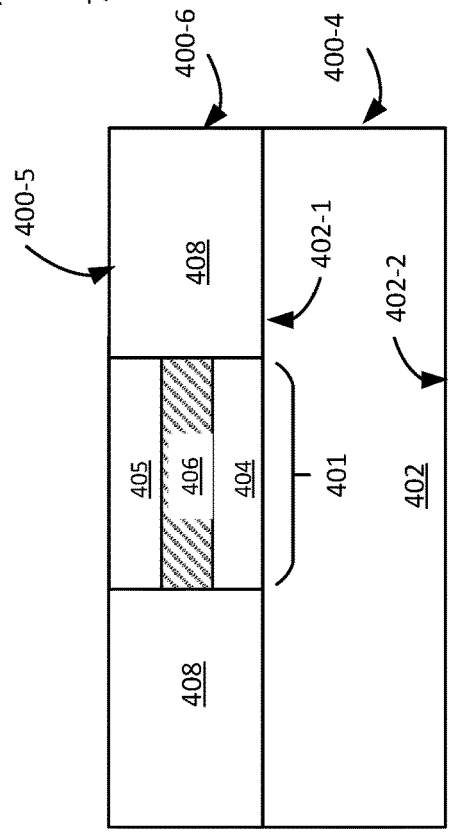
Figure 7C:
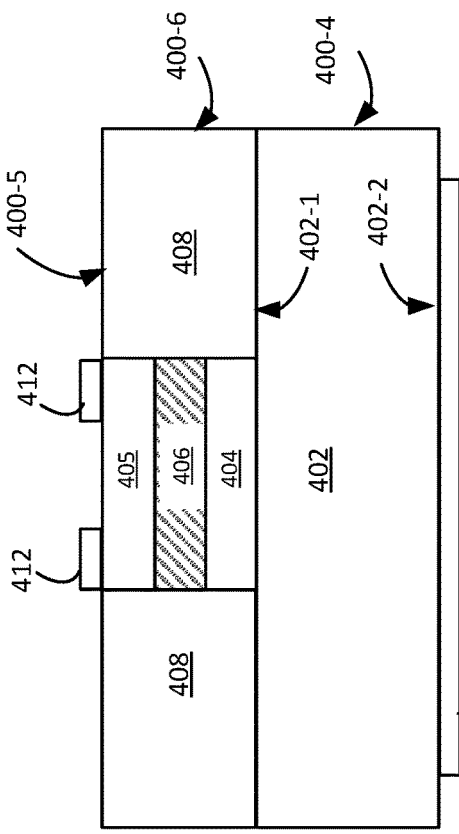

FIGS. 7B-7D are schematic diagrams illustrating a method of fabricating light source structure 700, in accordance with some embodiments. In FIG. 7B, VCSEL structure described above with respect to FIG. 4E is obtained including wall layer 408 deposited on portions of surface 402-1 of substrate 402 that are exposed after the etching described with respect to FIG. 4D. Wall layer 408 extends over surface 402-1 of substrate 402 such that side surface 400-6 of wall layer 408 is substantially aligned with side surface 400-4 of substrate. In FIG. 7C, bottom contact 414 is deposited on a portion (less than all of) surface 402-2 of substrate 402, and top contact 412 is deposited on top surface 400-1 of VCSEL 400. In some embodiments, contact 414 extends partially over DBR 405 and/or over side surface 400-3 of VCSEL 400.

In FIG. 7D, light barrier 702 is deposited over VCSEL 400 such that light barrier 702 extends along side surface 400-4 and side surface 400-6 and partially over top surface 400-5 of wall layer 408. In some embodiments, deposition of light barrier 702 is performed using deposition methods know in the art for performing patterned deposition. In some embodiments, deposition of light barrier 702 includes applying black matrix material by ink jet printing. In some embodiments, deposition of light barrier 702 includes photolithography techniques. In some embodiments, deposition of light barrier 702 includes processes discussed above with respect to deposition of light barrier 502 (e.g., FIGS. 5B-5E) or deposition of light barrier 602 (e.g., FIGS. 6B-6E).

Figure 8A:
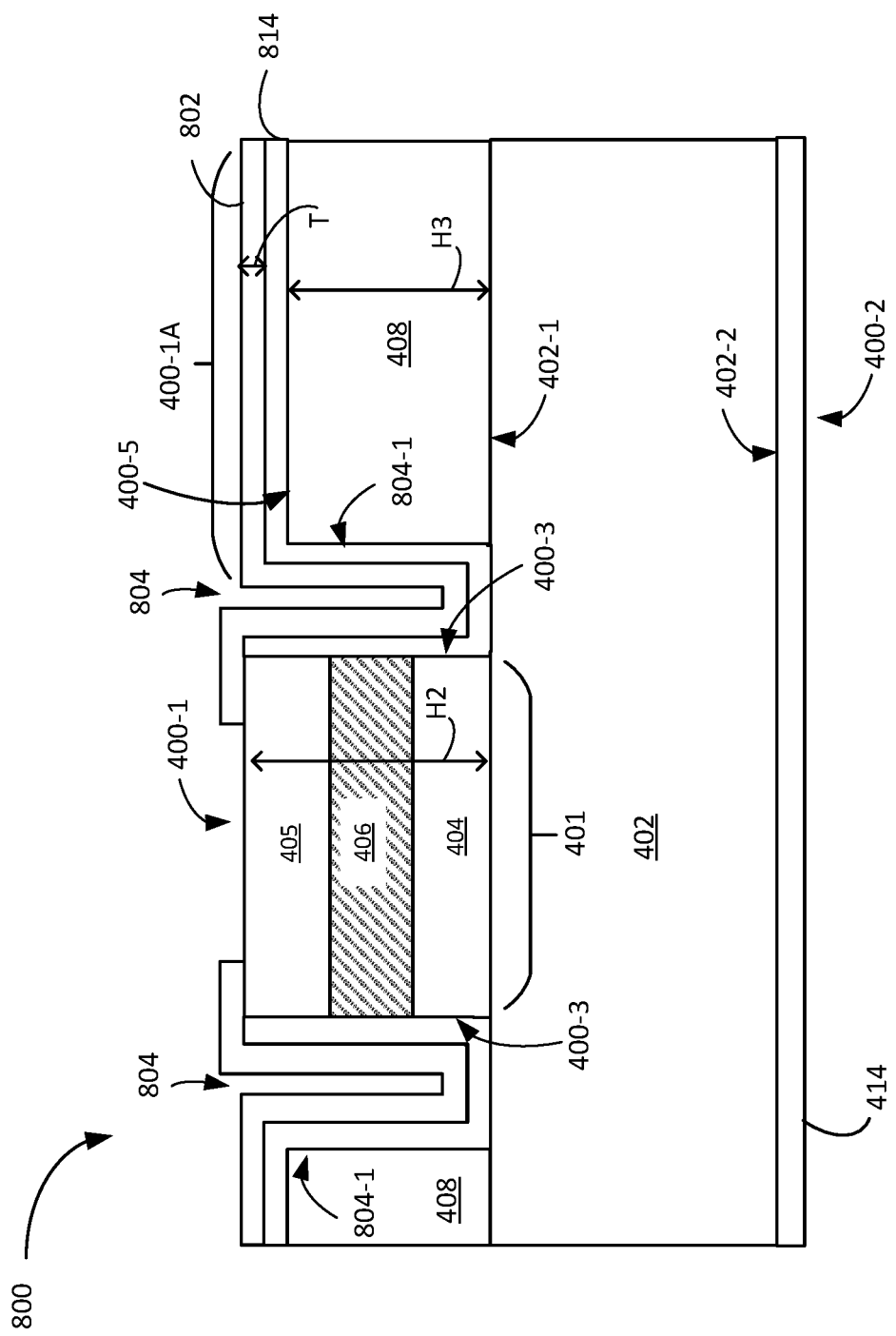
FIG. 8A is a schematic diagram illustrating a cross-sectional view of a light source structure, in accordance with some embodiments.

FIG. 8A is a schematic diagram illustrating a cross-sectional view of light source structure 800, in accordance with some embodiments. Light source structure 800 corresponds to light source structure 600 described above with respect to FIG. 6A, except that the wall layer 408 surrounding top portion 401 of VCSEL 400 in light source structure 800 forms a mesa structure with a steep edged cavity 804 bordered by side surface 400-3 of the top portion 401 of VCSEL 400 on one side, an edge 804-1 of wall layer 408 on another side, and a portion of top surface 402-1 of substrate 402 at the bottom. As shown, light source structure 800 further includes light barrier 802, which is a layer of light-blocking or absorbing material formed over at least a portion of a top surface 400-5 of wall layer 408 and extending to cover edge 804-1 of wall layer 408 that is facing the cavity 804, the portion of top surface 402-1 of substrate 402 at the bottom of cavity 804, side surface 400-3 of the top portion 401 of VCSEL 400 and a portion of top surface 400-1 of VCSEL 400. In some embodiments, cavity 804 does not extend all the way to top surface 402-1 of substrate 402. In some embodiment, cavity 804 only extends past DBR 405 and active layer 406. In some embodiments, cavity 804 extends past a top portion of DBR 404 without exposing top surface 402-1 of substrate 402. In some embodiments, cavity 804 is configured to isolate top portion 401 of VCSEL 400 from wall layer 408. In such embodiments where light barrier 802 includes metal, light barrier 802 also acts as top contact 412.

As shown in FIG. 8A, light source structure 800 further includes passivation layer 814 under at least a portion of the light barrier layer 802. Passivation layer 814 is configured to provide electrical stability by further isolating the n- and p-type doped portions of light source structure 800, as well as to protect surfaces of VCSEL 400 from environmental contaminants. In some embodiments, passivation layer 814 is formed over side surface 400-3 of the top portion 401 of VCSEL 400, the portion of top surface 402-1 of substrate 402 at the bottom of cavity 804, edge 804-1 of wall layer 408 that is facing the cavity 804, and over a top surface of wall layer 408. In some embodiment, passivation layer 814 includes one or more of $SiN_4$, $SiO_2$, $Al_xGa_{(1-x)}As$, or any other oxidized metal and oxidized semiconductor material, or a combination thereof. In some embodiments, wall layer 408, DBRs 404 and 405, and active layer 406 include $Al_xGa_{(1-x)}As$ and passivation layer 814 includes oxidized $Al_xGa_{(1-x)}As$. Light barrier 802 corresponding to light barrier 602 described with respect to FIG. 6A is disposed onto passivation layer 814 such that passivation layer 814 is under at least a portion of the light barrier layer 802. In some embodiments, light barrier layer 802 and passivation layer 814 together form a light barrier for VCSEL 400. In some embodiments, at least a portion of top surface 402-1 of DBR 405 remains uncovered allowing output of stimulated emission of light (e.g., stimulated emission of light through top surface 400-1 indicated with arrow 416 in FIG. 4A).

Figure 8D:
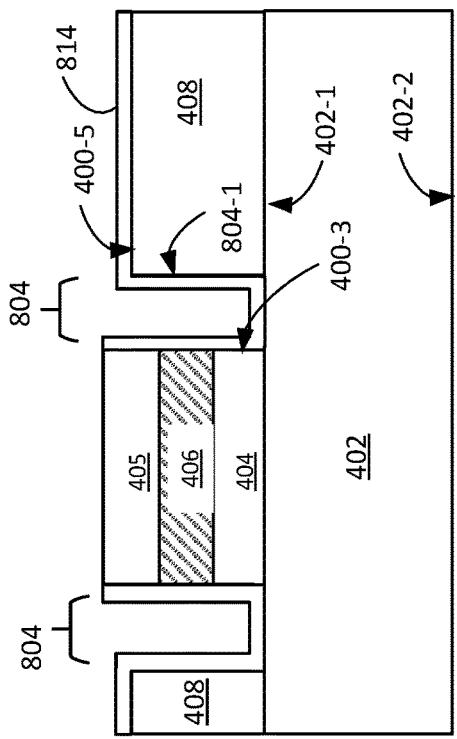
FIGS. 8B-8E are schematic diagrams illustrating a method of fabricating the light source structure of FIG. 8A, in accordance with some embodiments.
Figure 8E:
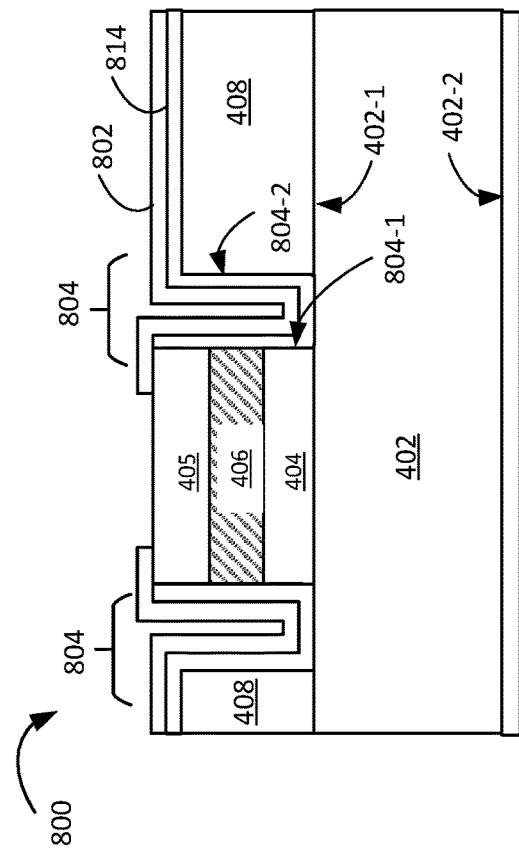
Figure 8B:
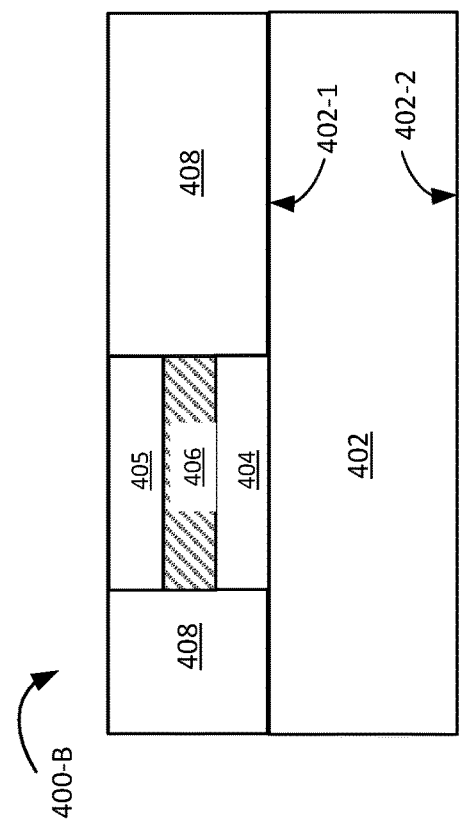
Figure 8C:
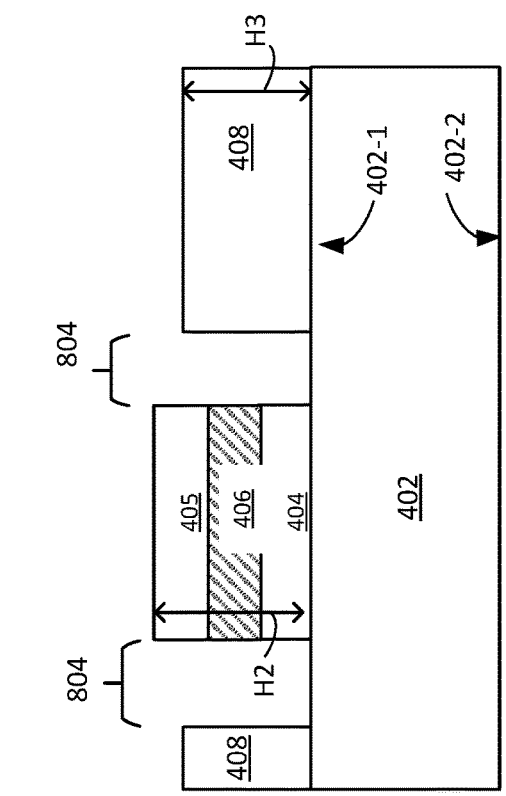

FIGS. 8B-8E are schematic diagrams illustrating a method of fabricating light source structure 800, in accordance with some embodiments. In FIG. 8B, VCSEL described above with respect to FIG. 4E is obtained including wall layer 408. In FIG. 8C, portions of wall layer 408 is removed to form a mesa structure with cavity 804 (e.g., by anisotropic etching using, e.g., a fluorine based or chlorine based dry etching or any other dry etching method known in the art). In some embodiments, portions of wall layer 408 are etched such that height H3 of wall layer 408 is less than height H2 of top portion 401 of VCSEL 400, as shown.

In FIG. 8D, passivation layer 814 is formed over side surface 400-3 of the top portion 401 of VCSEL 400, the portion of top surface 402-1 of substrate 402 at the bottom of cavity 804, edge 804-1 of wall layer 408 that is facing the cavity 804, and over a top surface of wall layer 408. In some embodiments, forming of passivation layer 814 includes deposition of one or more of $SiN_4$, $SiO_2$, $Al_xGa_{(1-x)}As$, or any other oxidized metal or oxidized semiconductor material, or a combination thereof by, e.g., chemical vapor deposition (CVD) or plasma-enhanced CVD). In some embodiments, forming of passivation layer 814 includes exposing the structure of FIG. 8D to oxidizing conditions. In some embodiments, wall layer 408, DBRs 404 and 405, and active layer 406 include $Al_xGa_{(1-x)}As$, and passivation layer 814 is formed by oxidizing (e.g., by thermal oxidation or wet oxidation processes known in the art). In some embodiments, the oxidation is performed selectively. For example, $Al_xGa_{(1-x)}As$ with different aluminum concentration can be oxidized differently. Therefore, by configuring DBR 405 such that a top layer of DBR 405 near top surface 400-1 has an aluminum concentration that is much lower than the layers under the top layer of DBR 405, the top layer of DBR 405 near top surface 400-1 is not oxidized as readily as other exposed surfaces of VCSEL 400. As a result, passivation layer 814 can be formed on side surface 400-3 without extending to top surface 400-1. In some embodiments, the oxidation is performed universally so that surface 400-1 of DBR 405 is also oxidized and is later removed subsequent to oxidation such that surface 400-1 of DBR 405 is exposed. In FIG. 8E, light barrier 802 is deposited on VCSEL 400 to form light source structure 800. Deposition of light barrier 802 includes any of the methods described above with respect to FIGS. 5B-5E, 6B-6E and 7B-7D. In FIG. 8E, bottom contact 414 is deposited on surface 402-2 of substrate 402, as described above. In embodiments where light barrier 802 includes non-conducting material (e.g., black matrix material), top contacts 412 (e.g., as illustrated in FIG. 5A) are also deposited on light source structure 800.

Figure 9:
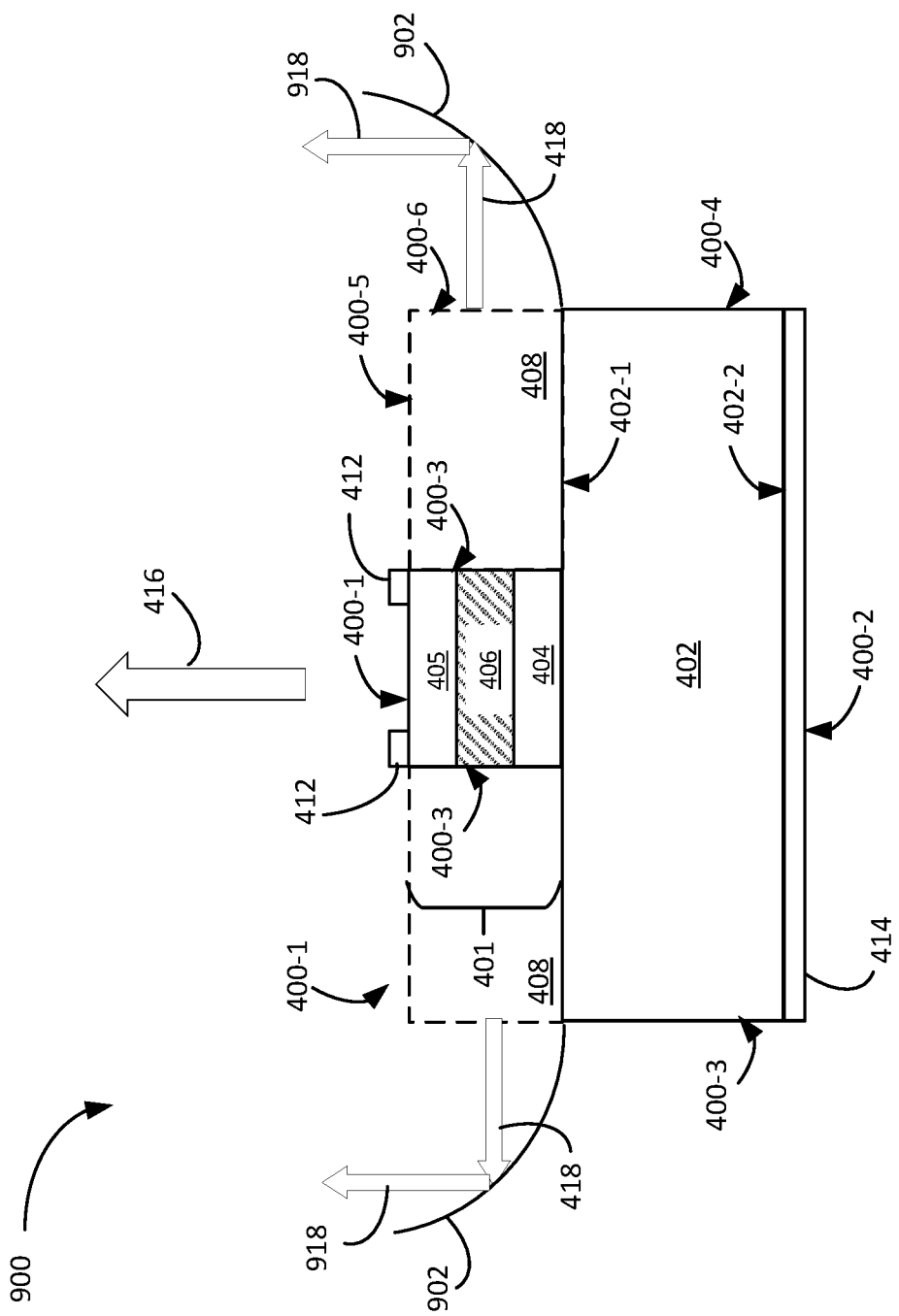
FIG. 9 is a schematic diagram illustrating a cross-sectional view of a light source structure, in accordance with some embodiments.

FIG. 9 is a schematic diagram illustrating a cross-sectional view of light source structure 900, in accordance with some embodiments. Light source structure 900 includes VCSEL 400 including top portion 401 of VCSEL 400 and optional wall layer 408 disposed on substrate 402, as described with respect to FIG. 4A. Light source structure 900 further includes light barrier 902 (e.g., a reflective, diffractive, or refractive optical element) surrounding at least top portion 401 of VCSEL 400. Light barrier 902 is configured to receive and redirect spontaneous emission of light output by VCSEL 400 through side surfaces 400-3 (e.g., spontaneous emission of light indicated with arrows 418).

Light barrier 902 is separated from side surfaces 400-3 of VCSEL 400 by a distance. In some embodiments, the distance is defined by optional wall layer 408 and light barrier 902 is positioned adjacent to side surface 400-6. In some embodiments, the distance is defined by a gap (e.g., gap 512 described with respect to FIG. 5A). For example, light barrier 902 is positioned on top surface 402-1 of substrate 402 such that there is a gap between side surface 400-3 and light barrier 902. In some embodiments, light barrier 902 and top portion 401 of VCSEL 400 have about the same height extending from top surface 402-1 of substrate 402 to top surfaces of light barrier 902 and DBR 405.

As shown in FIG. 9, light barrier 902 includes a curved reflective surface (e.g., a curved metal surface). Light barrier 902 is configured receive the spontaneous emission illustrated with arrows 418 and reflect the spontaneous emission, as shown with arrows 918. In some embodiments, a direction of the reflected spontaneous emission shown with arrows 918 is substantially the same as a direction of directed emission indicated with arrows 416 (e.g., the angle between the direction of the reflected spontaneous emission and the direction of directed emission is less than 30 degrees, 20 degrees, or 10 degrees). For example, the spontaneous emission is also directed toward an eye of a pupil of a user (e.g., as described with respect to FIGS. 3A and 3B). In some embodiments, light barrier 902 is a diffractive or a refractive optical element (e.g., a lens or a grating). In some embodiments, light barrier 902 has a flat or a curved surface.

Light source structure 900 including light barrier 902 can be formed by existing semiconductor fabrication technologies, such as those described with respect to forming of light source structures 500, 600, 700, and 800 above. For example, light barrier 902 is formed by etching a portion of an adjacent material to obtain a curved or slanted surface and coating the etched surface with a reflective material.

In light of these principles, we now turn to certain embodiments of the present disclosure.

In accordance with some embodiments, a light source structure includes a vertical cavity surface-emitting laser (VCSEL) device (e.g., light source structure 500 in FIG. 5A includes VCSEL 400 in FIG. 4A) having a top surface (e.g., top surface 400-1) and at least one side surface (e.g., side surface 400-3) substantially perpendicular to and adjoining the top surface. The VCSEL device is configurable to output directed emission of light through the top surface (e.g., directed emission of light illustrated with arrow 416 in FIG. 4A). The light source structure also includes a light barrier (e.g., light barrier 502) surrounding at least a top portion of the VCSEL device and separated from the at least one side surface. The light barrier is configured to receive spontaneous emission (e.g., spontaneous emission of light illustrated with arrows 418 in FIG. 4A) out of the VCSEL device through the at least one side surface.

In some embodiments, the light source structure has at least one dimension (e.g., D1 or D2 in FIG. 5F) ranging from 100 micrometer to 200 micrometer. In some embodiments, the light structure has at least one dimension ranging from 100 micrometer to 175 micrometer, 100 micrometer to 150 micrometer, or 100 micrometer to 125 micrometer. In some embodiments, the light structure has at least one dimension of 100 micrometer, 110 micrometer, 120 micrometer, 130 micrometer, 140 micrometer, 150 micrometer, 160 micrometer, 170 micrometer, 180 micrometer, 190 micrometer, or 160 micrometer. In some embodiments, the light source structure has a top surface area ranging from 100×100 micrometers to 200×200 micrometers. In some embodiments, the light source structure has a top surface area of 100×100 micrometer, 110×110 micrometer, 120×120 micrometers, 130×130 micrometers, 140×140 micrometer, 150×150 micrometer, 160×160 micrometer, 170×170 micrometer, 180×180 micrometer, 190×190 micrometer, or 200×200 micrometer. In some embodiments, the light source structure has a circular shape or elliptical shape. In some embodiments, a diameter or an axis of a circle or an ellipse, respectively, is 100 micrometer, 110 micrometer, 120 micrometer, 130 micrometer, 140 micrometer, 150 micrometer, 160 micrometer, 170 micrometer, 180 micrometer, 190 micrometer, or 200 micrometer.

In some embodiments, a thickness of the light barrier (e.g., thickness T of light barrier 602 in FIG. 6A) is ranging from two micrometers to ten micrometers.

In some embodiments, the top portion of the VCSEL device and the light barrier are disposed on a substrate (e.g., top portion 400-1 of VCSEL 400 and light barrier 502 are disposed on substrate 402 in FIG. 5A), and have about the same height (e.g., height H1) from a surface of the substrate.

In some embodiments, the light barrier is formed on a mesa structure (e.g., cavity 804) around the top portion of the VCSEL device and extends to cover at least a top surface and an edge of the mesa structure. A mesa structure refers a cavity having a steep edge around a VCSEL. In some embodiments, the mesa structure is formed by ion etching or other dry etching method.

In some embodiments, the light barrier includes a passivation layer (e.g., passivation layer 814) over the mesa structure and extending onto the at least one side surface of the VCSEL device (e.g., edge 804-1). In some embodiments, the passivation layer includes a silicon nitride layer. The light barrier also includes a metal layer over the passivation layer (e.g., light barrier 802).

In some embodiments, the metal layer extends to and covers an outer portion of the top surface of the VCSEL device (e.g., portion 400-1A of surface 400-1 of VCSEL 400 in FIG. 8A).

In some embodiments, top portion of the VCSEL device includes a substrate (or is partially embedded in) (e.g., top portion 400-1 of VCSEL 400 includes wall layer 408 in FIG. 6A), and the light barrier further surrounds the substrate (on sidewalls of the substrate) (e.g., light barrier 602 surrounds wall layer 408 in FIG. 6A).

In some embodiments, the VCSEL device is disposed on a first surface of the substrate (e.g., surface 402-1 of substrate 402 in FIG. 5A) and a metal layer (e.g., n-contact) is disposed on a second surface (e.g., surface 402-2) of the substrate opposite to the first surface.

In some embodiments, the light barrier includes black matrix material. In some embodiments, the light barrier includes metal (e.g., gold).

In accordance with some embodiments, a method of making a light source structure includes fabricating a vertical cavity surface-emitting laser (VCSEL) device on a substrate (e.g., FIGS. 5B-5E). The VCSEL device has a top surface and at least one side surface substantially perpendicular to and adjoining the top surface. The VCSEL device is configurable to output directed emission of light through the top surface. The method also includes forming a light barrier surrounding at least a top portion of the VCSEL device and separated from the at least one side surface. The light barrier is configured to receive spontaneous emission out of the VCSEL device through the at least one side surface.

In some embodiments, forming the light barrier includes depositing a sacrificial layer over the VCSEL device and a top surface of the substrate and removing portions of the sacrificial layer on the top surface of the substrate (e.g., FIGS. 5B-5E). Forming the light barrier further includes depositing a light barrier layer over the substrate to form the light barrier and removing portions of the sacrificial layer on the VCSEL device.

In some embodiments, forming the light barrier includes forming mesa structure around the top portion of the VCSEL device and separated from the at least one side surface by a cavity (e.g., FIGS. 8B-8E). Forming the light barrier further includes oxidizing exposed surfaces of the VCSEL device and the mesa structure and forming a passivation layer over the mesa structure. The passivation layer extends to cover a top surface of the mesa structure, an edge of the mesa structure facing the cavity, a bottom surface of the trench and the at least one side surface of the VCSEL device. Forming the light barrier also includes forming a metal layer over the passivation layer and an outer portion of the top surface of the VCSEL device.

In some embodiments, the substrate has a top surface parallel with the top surface of the VCSEL device and at least one side surface substantially perpendicular to the top surface of the VCSEL device (e.g., FIGS. 6B-6E). Forming the light barrier includes coating exposed surfaces of the VCSEL device and at least one side surface of the substrate with a light-blocking material and removing portions of the light-blocking material from surfaces of the VCSEL device and a middle part of the top surface of the substrate adjacent the VCSEL device.

In some embodiments, the light blocking material is back matrix material. Removing portion of the light-blocking material is done using photolithography.

In some embodiments, coating the exposed surfaces of the VCSEL device and the substrate with the black matrix material includes inkjet printing.

In accordance with some embodiments, an eye-tracking apparatus (e.g., eye-tracking device 360 in FIG. 3B) includes a light source structure (e.g., light source structure 362) configured to project light to an eye of a user and a photodetector (e.g., photodetector 364) configured to receive the light projected by the light source structure reflected off the eye of the user. The light source (e.g., light source structure 500 in FIG. 5A) structure includes a vertical cavity surface-emitting laser (VCSEL) device having a top surface and at least one side surface substantially perpendicular to and adjoining the top surface. The VCSEL device is configurable to output directed emission of light through the top surface. The light source structure also includes a light barrier surrounding at least a top portion of the VCSEL device and separated from the at least one side surface. The light barrier is configured to block spontaneous emission out of the VCSEL device through the at least one side surface from reaching the photodetector.

In some embodiments, the light source and the photodetector are formed on a same substrate (e.g., substrates 368-1 and 368-2 form a single uniform substrate in FIG. 3B). The light source structure described above is configured to reduce light output by the VCSEL device due to spontaneous emission thereby preventing (or reducing) detection of the light output by the VCSEL device due to the spontaneous emission by the photodetector.

In accordance with some embodiments, a head-mounted display device (e.g., display device 100 in FIG. 1) includes a display (e.g., array of light emission devices 320 in FIG. 3A), an optical assembly (e.g., one or more optical components 330) optically coupled to the display, and the eye-tracking apparatus (e.g., eye-tracking device 360) described above disposed proximate to the display and the optical assembly.

Although various drawings illustrate operations of particular components or particular groups of components with respect to one eye, a person having ordinary skill in the art would understand that analogous operations can be performed with respect to the other eye or both eyes. For brevity, such details are not repeated herein.

Although some of various drawings illustrate a number of logical stages in a particular order, stages which are not order dependent may be reordered and other stages may be combined or broken out. While some reordering or other groupings are specifically mentioned, others will be apparent to those of ordinary skill in the art, so the ordering and groupings presented herein are not an exhaustive list of alternatives. Moreover, it should be recognized that the stages could be implemented in hardware, firmware, software or any combination thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A light source structure, comprising:
    a vertical cavity surface-emitting laser (VCSEL) device having a top surface and at least one side surface substantially perpendicular to and adjoining the top surface, the VCSEL device being configurable to output directed emission of light through the top surface; and
    a light barrier surrounding at least a top portion of the VCSEL device, the light barrier in its entirety being separated from the at least one side surface, the light barrier being configured to receive spontaneous emission out of the VCSEL device through the at least one side surface and absorb the received spontaneous emission, the light barrier being formed on a mesa structure around the top portion of the VCSEL device and extends to cover at least a top surface and an edge of the mesa structure.

2. The light source structure of claim 1, the light source structure has at least one dimension ranging from 100 micrometers to 200 micrometers.

3. The light source structure of claim 1, a thickness of the light barrier is between two micrometers and ten micrometers.

4. The light source structure of claim 1, wherein the top portion of the VCSEL device and the light barrier are disposed on a substrate, and have about a same height from a surface of the substrate.

5. The light source structure of claim 1, further comprising:
    a passivation layer over the mesa structure and extending onto the at least one side surface of the VCSEL device, wherein the light barrier includes a metal layer located over the passivation layer.

6. The light source structure of claim 5, wherein the metal layer extends to and covers an outer portion of the top surface of the VCSEL device.

7. The light source structure of claim 1, wherein the VCSEL device is disposed on a substrate, and wherein the light barrier further surrounds side walls of the substrate.

8. The light source structure of claim 7, wherein the VCSEL device is disposed on a first surface of the substrate and a metal layer is disposed on a second surface of the substrate opposite to the first surface.

9. The light source structure of claim 7, wherein the light barrier includes black matrix material.

10. The light source structure of claim 1, wherein the light barrier includes metal.

11. A method of making a light source structure, comprising:
    fabricating a vertical cavity surface-emitting laser (VCSEL) device on a substrate, the VCSEL device having a top surface and at least one side surface substantially perpendicular to and adjoining the top surface, the VCSEL device being configurable to output directed emission of light through the top surface; and
    forming a light barrier surrounding at least a top portion of the VCSEL device, the light barrier in its entirety being separated from the at least one side surface, the light barrier being configured to receive spontaneous emission out of the VCSEL device through the at least one side surface, wherein forming the light barrier includes:
depositing a sacrificial layer over the VCSEL device and a top surface of the substrate;
removing portions of the sacrificial layer on the top surface of the substrate;
subsequent to removing the portions of the sacrificial layer on the top surface of the substrate, depositing a light barrier layer over the substrate to form the light barrier; and
subsequent to depositing the light barrier layer, removing portions of the sacrificial layer on the VCSEL device.

12. The method of claim 11, wherein forming the light barrier includes:
forming a mesa structure around the top portion of the VCSEL device and separated from the at least one side surface by a cavity;
oxidizing exposed surfaces of the VCSEL device and the mesa structure;
forming a passivation layer over the mesa structure, the passivation layer extending to cover a top surface of the mesa structure, an edge of the mesa structure facing the cavity, a bottom surface of the cavity and the at least one side surface of the VCSEL device; and
forming a metal layer over the passivation layer and an outer portion of the top surface of the VCSEL device.

13. The method of claim 11, wherein the substrate has a top surface parallel with the top surface of the VCSEL device and at least one side surface substantially perpendicular to the top surface of the VCSEL device, and wherein forming the light barrier includes:
coating exposed surfaces of the VCSEL device and at least one side surface of the substrate with a light-blocking material; and
removing portions of the light-blocking material from a middle part of the top surface of the substrate adjacent the VCSEL device.

14. The method of claim 13, wherein the light-blocking material is black matrix material, and wherein removing portion of the light-blocking material is done using photolithography.

15. The method of claim 14, wherein coating the exposed surfaces of the VCSEL device and the at least one side surface of the substrate with the black matrix material includes inkjet printing.

16. An eye-tracking apparatus comprising:
a light source structure configured to project light to an eye of a user; and
a photodetector configured to receive the light projected by the light source structure reflected off the eye of the user, wherein the light source structure includes:
a vertical cavity surface-emitting laser (VCSEL) device having a top surface and at least one side surface substantially perpendicular to and adjoining the top surface, the VCSEL device being configurable to output directed emission of light through the top surface; and
a light barrier surrounding at least a top portion of the VCSEL device, the light barrier in its entirety being separated from the at least one side surface, the light barrier being configured to block spontaneous emission out of the VCSEL device through the at least one side surface from reaching the photodetector, the light barrier being formed on a mesa structure around the top portion of the VCSEL device and extends to cover at least a top surface and an edge of the mesa structure.

17. The eye-tracking apparatus of claim 16, wherein the light source structure and the photodetector are formed on a same substrate.

18. A head-mounted display device, comprising:
a display;
an optical assembly optically coupled to the display; and
the eye-tracking apparatus of claim 16 disposed proximate to the display and the optical assembly.

* * * * *